(12) United States Patent
Toshima et al.

(10) Patent No.: US 7,836,900 B2
(45) Date of Patent: Nov. 23, 2010

(54) SUBSTRATE PROCESSING SYSTEM, SUBSTRATE PROCESSING METHOD, RECORDING MEDIUM AND SOFTWARE

(75) Inventors: Takayuki Toshima, Koshi (JP); Naoki Shindo, Nirasaki (JP); Hiroshi Yano, Tokyo (JP); Kotaro Tsurusaki, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 918 days.

(21) Appl. No.: 10/591,971

(22) PCT Filed: Mar. 25, 2005

(86) PCT No.: PCT/JP2005/005506

§ 371 (c)(1),
(2), (4) Date: Sep. 7, 2006

(87) PCT Pub. No.: WO2005/098918

PCT Pub. Date: Oct. 20, 2005

(65) Prior Publication Data

US 2007/0175062 A1    Aug. 2, 2007

(30) Foreign Application Priority Data

Apr. 2, 2004    (JP)    ............................. 2004-110310

(51) Int. Cl.
*B08B 5/00*    (2006.01)
(52) U.S. Cl. .................................. 134/104.2; 134/902
(58) Field of Classification Search .............. 134/104.2, 134/902

See application file for complete search history.

(56) References Cited

U.S. PATENT DOCUMENTS

| | | | | |
|---|---|---|---|---|
| 3,277,907 A | * | 10/1966 | Goldman | 134/108 |
| 3,777,571 A | * | 12/1973 | Jaeger | 73/863.81 |
| 3,990,462 A | * | 11/1976 | Elftmann et al. | 134/102.1 |
| 5,369,891 A | * | 12/1994 | Kamikawa | 34/78 |
| 5,657,553 A | * | 8/1997 | Tarui et al. | 34/78 |
| 5,715,612 A | * | 2/1998 | Schwenkler | 34/470 |

(Continued)

FOREIGN PATENT DOCUMENTS

CN    1194454    9/1998

(Continued)

OTHER PUBLICATIONS

European Patent Office 1 641 027 Mar. 2006.*

(Continued)

*Primary Examiner*—Frankie L Stinson
(74) *Attorney, Agent, or Firm*—Morrison & Foerster LLP

(57) ABSTRACT

A substrate processing system 1 comprises: a processing tank 3 for processing substrates W with a processing liquid; a drying unit 6 disposed above the processing tank 3; and a carrying mechanism 8 for carrying the substrates W between the processing tank 3 and the drying unit 6. A processing gas supply line 21 for supplying a processing gas into the drying unit 6 and inert gas supply lines 24 and 25 for supplying an inert gas into the drying unit 6 are connected to the drying unit 6. A first discharge line for discharging an atmosphere purged from the drying unit 6 and a second discharge line 27 for forcibly exhausting the drying unit 6 are connected to the drying unit 6.

6 Claims, 13 Drawing Sheets

U.S. PATENT DOCUMENTS

| | | | |
|---|---|---|---|
| 5,855,077 A * | 1/1999 | Nam et al. | 34/409 |
| 6,045,624 A * | 4/2000 | Kamikawa et al. | 134/30 |
| 6,158,141 A * | 12/2000 | Asada et al. | 34/74 |
| 6,413,355 B1 | 7/2002 | Kamikawa et al. | |
| 6,575,178 B1 * | 6/2003 | Kamikawa | 134/88 |
| 6,615,510 B2 * | 9/2003 | Jones et al. | 34/448 |
| 6,663,721 B2 * | 12/2003 | Egashira et al. | 134/19 |
| 6,779,534 B2 | 8/2004 | Yamaguchi et al. | |
| 7,255,115 B2 * | 8/2007 | Kwon et al. | 134/102.2 |

FOREIGN PATENT DOCUMENTS

| | | |
|---|---|---|
| CN | 1442881 | 9/2003 |
| EP | 0855736 | 9/2004 |
| JP | 07-130699 | 5/1995 |
| JP | 08-081778 A | 3/1996 |
| JP | 08-148465 | 6/1996 |
| JP | 2000-250424 A | 9/2000 |
| JP | 2001-051428 | 2/2001 |
| JP | 2001-144065 * | 5/2001 |
| JP | 2002-231685 | 8/2002 |
| JP | 2003-257926 | 9/2003 |
| JP | 2003-279246 | 10/2003 |

OTHER PUBLICATIONS

Office Action mailed Aug. 7, 2009, for JP Application No. 2006-512023, with English Translation, four pages.

\* cited by examiner

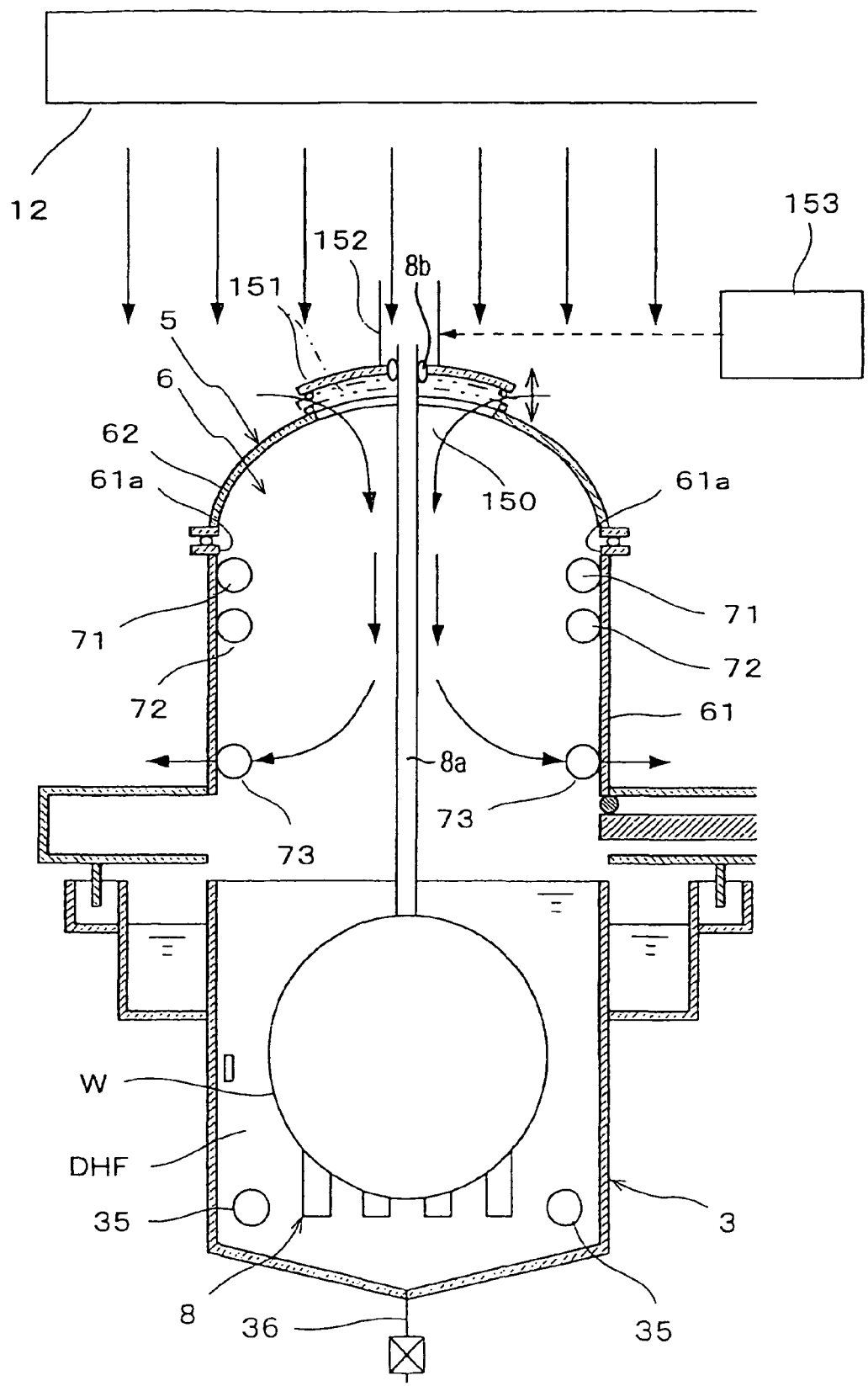
F I G. 13

SUBSTRATE PROCESSING SYSTEM, SUBSTRATE PROCESSING METHOD, RECORDING MEDIUM AND SOFTWARE

TECHNICAL FIELD

The present invention relates to a substrate processing system, a substrate processing method, a recording medium and software.

BACKGROUND ART

Semiconductor device-fabricating processes, for example, use various type of cleaning apparatuses for cleaning a semiconductor wafer (hereinafter, referred to simply as "wafer"). For example, a cleaning process for cleaning a wafer having a surface coated with a polysilicon film before forming a tungsten silicide film or the like on the polysilicon film includes a step of immersing the wafer in a chemical, such as a dilute hydrofluoric acid solution (DHF solution), contained in a processing tank, a step of rinsing the wafer with pure water, and a step of drying the wafer by spraying isopropyl alcohol (IPA) or steam on the wafer.

A known cleaning system for carrying out such a cleaning process disclosed, for example, in Patent document 1 includes a processing tank for carrying out a chemical process, and a drying unit for carrying out a drying process disposed above the processing tank. A top cover covering an open upper end of a vessel is opened, a wafer is carried through the open upper end into the vessel, and the wafer is moved down through a drying unit placed in the vessel into a processing tank. Then, the wafer is subjected to a chemical process and a rinsing process, the wafer is raised into the drying unit, and IPA vapor is sprayed on the wafer for drying while the wafer is being raised through the drying unit. Subsequently, the vessel is purged by using nitrogen gas, and then the top cover is opened to carry out the wafer from the vessel.

Patent document 1: Jpn. Pat. No. 3126858

A conventional substrate-processing system has a difficulty in controlling air currents in the drying unit. Consequently, a chemical atmosphere produced in the processing tank flows upward into the drying unit and remains on the inside surface of the vessel. Since the IPA vapor tends to adhere to the inside surface of the vessel, the IPA vapor cannot be efficiently sprayed on the wafer. Consequently, a large quantity of the IPA vapor is consumed and the IPA vapor stays on the inside surface of the vessel. The chemical atmosphere and the IPA vapor remaining on the surface of the wafer form a water mark on the surface of the wafer, obstruct the formation of a normal film on the surface of the thus cleaned wafer and cause problems in the electrical characteristic of semiconductor devices formed by processing the wafer.

DISCLOSURE OF THE INVENTION

It is an object of the present invention to provide a substrate-processing system including a processing tank and a drying unit disposed above the processing tank, capable of preventing the flow of a chemical gas into the drying unit and of surely purging the drying unit of processing gases, a substrate-processing method, a recording medium and software.

A substrate processing system in a first aspect of the present invention includes: a processing tank for processing substrates with a processing liquid; a drying unit disposed above the processing tank; a carrying mechanism for carrying the substrates between the processing tank and the drying unit; a processing gas supply line for supplying a processing gas into the drying unit; an inert gas supply line for supplying an inert gas into the drying unit; a first discharge line for discharging an atmosphere purged from the drying unit; and a second discharge line for forcibly exhausting the drying unit.

In the substrate processing system according to the present invention, a first inert gas supply line for carrying a heated inert gas is connected to the processing gas supply line, and the inert gas supply line serves as a second inert gas supply line for carrying an inert gas of an ordinary temperature.

In the substrate processing system according to the present invention, the drying unit is provided with discharge pipes each having a base part connected to the first discharge line and a free end part inserted in the drying unit, each of the discharge pipes is provided with a plurality of inlet holes arranged in a line, areas of the inlet holes of each discharge pipe nearer to the base part are smaller and those of the inlet holes of the discharge pipe nearer to the free end part are greater.

In the substrate processing system according to the present invention, the drying unit is constructed such that the drying unit can be set in an open state in which the drying unit opens into the outside atmosphere when the carrying mechanism carries the substrates into the processing tank and in a closed state in which the interior of the drying unit is isolated from the atmosphere, and a controller sets the drying unit selectively in either of the open state in which the drying unit opens into the outside atmosphere and the closed state in which the interior of the drying unit is isolated from the outside atmosphere.

In the substrate processing system according to the present invention, the processing tank processes the substrate with a chemical and a rising liquid, and the controller opens the drying unit into the outside atmosphere when the chemical is contained in the processing tank, isolates the interior of the drying unit from the outside atmosphere upon the completion of replacing the chemical contained in the processing tank with the rinsing liquid and isolates the interior of the drying unit from the outside atmosphere while the drying unit is operating for a drying process.

In the substrate processing system according to the present invention, the drying unit includes a vessel body having an open end, a top cover for covering the open end of the vessel body, and a top cover lifting mechanism combined with the top cover and capable of placing the top cover at an open position for carrying the substrates into and out of the vessel body, a half-open position for forming a gap between the open end of the vessel body and the top cover or a closing position for closing the open end of the vessel body, the top cover lifting mechanism is controlled by the controller, and the controller controls the top cover lifting mechanism to place the top cover at the open position or the half-open position to open the drying unit into the outside atmosphere and to place the top cover at the closing positing to isolate the interior of the drying unit from the outside atmosphere.

In the substrate processing system according to the present invention, the drying unit includes a vessel body defining a chamber and having an open end, a top cover for covering the open end of the vessel body, the top cover is provided with a vent, a vent closing member closes the vent, and the controller controls the vent closing member.

A substrate processing system in a second aspect of the present invention includes: a processing tank for processing substrates with a processing liquid; a drying unit disposed above the processing tank; and a carrying mechanism for carrying the substrates between the processing tank and the drying unit; wherein the drying unit can be set in an open state in which the drying unit is opened into the outside atmosphere when the carrying mechanism carries the substrates into the processing tank or a closed state in which the interior of the drying unit is isolated from the outside atmosphere, and a controller sets the drying unit selectively in the open state in which the drying unit is opened into the outside atmosphere or the closed state in which the interior of the drying unit is isolated from the atmosphere.

In the substrate processing system according to the present invention, the processing tank processes the substrate with a chemical and a rising liquid, and the controller opens the drying unit into the outside atmosphere when the chemical is contained in the processing tank, isolates the interior of the drying unit from the outside atmosphere upon the completion of replacement of the chemical contained in the processing tank with the rinsing liquid, and isolates the interior of the drying unit from the outside atmosphere while the drying unit is operating for a drying process.

In the substrate processing system according to the present invention, the drying unit includes a vessel body defining a chamber and having an open end, a top cover for covering the open end of the vessel body, and a top cover lifting mechanism combined with the top cover and capable of placing the top cover at an open position for carrying the substrates through the open end of the vessel body into and out of the vessel body, a half-open position for forming a gap between the open end of the vessel body and the top cover or a closing position for closing the open end of the vessel body, the top cover lifting mechanism is controlled by the controller, and the controller places the top cover at the open position or the half-open position to open the drying unit into the outside atmosphere and places the top cover at the closing positing to isolate the interior of the drying unit from the outside atmosphere.

In the substrate processing system according to the present invention, the drying unit includes a vessel body defining a chamber and having an open end and a top cover for covering the open end of the vessel body, the top cover is provided with a vent, a vent closing member closes the vent, and the controller controls the vent closing member.

A substrate processing method in a third aspect of the present invention to be carried out by a substrate processing system including a processing tank for processing a substrate and a drying unit disposed above the processing tank comprises: a chemical processing step of chemically processing substrates with a chemical contained in the processing tank; a processing liquid changing step of replacing the chemical contained in the processing tank with a rinsing liquid; and a drying step of drying the substrates by the drying unit; wherein fresh air is supplied into the drying unit and the drying unit is exhausted of gases during the chemical processing step, and an inert gas is supplied into the drying unit and the drying unit is exhausted at a discharge rate lower than that at which the drying unit is exhausted during the chemical processing step after the chemical contained in the processing tank has been replaced with the rinsing liquid.

A substrate processing method in a fourth aspect of the present invention to be carried out by a substrate processing system including a processing tank for processing a substrate and a drying unit disposed above the processing tank, and provided with an opening and a lied for covering the opening comprises: a loading step of opening the top cover and carrying a substrate through the opening of the drying unit into the processing tank; a chemical processing step of chemically processing the substrate with a chemical contained in the processing tank; a processing liquid changing step of replacing the chemical contained in the processing tank with a rinsing liquid; and a drying step of drying the substrate by the drying unit with the opening closed by the top cover; wherein the top cover is removed to open the opening of the drying unit and the drying unit is exhausted of gases during the chemical processing step, and the opening of the drying unit is covered with the top cover, an inert gas is supplied into the drying unit and the drying unit is exhausted after the chemical contained in the processing tank has been replaced with the rinsing liquid.

In the substrate processing method according to the present invention, a gap between the top cover and the open end during the chemical processing step is narrower than a gap between the top cover and the open end during the loading step.

In the substrate processing method according to the present invention, after the chemical contained in the processing tank has been replaced with the rinsing liquid, the drying unit is exhausted at a discharge rate lower than that at which the drying unit is exhausted during the chemical processing step.

A recording medium in a fifth aspect of the present invention storing software to be executed by a control computer for controlling a substrate processing system, including a processing tank for processing substrates and a drying unit disposed above the processing tank, to make the substrate processing system carry out a substrate processing method including: a chemical processing step of chemically processing substrates with a chemical contained in the processing tank; a processing liquid changing step of replacing the chemical contained in the processing tank with a rinsing liquid; and a drying step of drying the substrates by the drying unit; wherein fresh air is supplied into the drying unit and the drying unit is exhausted of gases during the chemical processing step, and after the chemical contained in the processing tank has been replaced with the rinsing liquid, an inert gas is supplied into the drying unit and the drying unit is exhausted at a discharge rate lower than that at which the drying unit is exhausted during the chemical processing step.

Software in a sixth aspect of the present invention to be executed by a control computer for controlling a substrate processing system, including a processing tank for processing substrates and a drying unit disposed above the processing tank, to make the substrate processing system carry out a substrate processing method including: a chemical processing step of chemically processing substrates with a chemical contained in the processing tank; a processing liquid changing step of replacing the chemical contained in the processing tank with a rinsing liquid; and a drying step of drying the substrates by the drying unit; wherein fresh air is supplied into the drying unit and the drying unit is exhausted of gases during the chemical processing step, and after the chemical contained in the processing tank has been replaced with the rinsing liquid, an inert gas is supplied into the drying unit and the drying unit is exhausted at a discharge rate lower than that at which the drying unit is exhausted during the chemical processing step.

A recording medium in a seventh aspect of the present invention storing software to be executed by a control computer for controlling a substrate processing system, including a processing tank for processing substrates, and a drying unit disposed above the processing tank, having an open end, and provided with a top cover covering the open end, to make the substrate processing system carry out a substrate processing method including: a loading step of opening the top cover and carrying substrates through the open end of the drying unit into the processing tank; a chemical processing step of chemically processing the substrates with a chemical contained in the processing tank; a processing liquid changing step of replacing the chemical contained in the processing tank with a rinsing liquid; and a drying step of drying the substrates by the drying unit with the open end closed by the top cover; wherein the top cover is removed to open the open end of the drying unit and the drying unit is exhausted of gases during the chemical processing step, and after the chemical contained in the processing tank has been replaced with the rinsing liquid, the open end of the drying unit is covered with the top cover, an inert gas is supplied into the drying unit and the drying unit is exhausted.

Software in an eighth aspect of the present invention to be executed by a control computer for controlling a substrate processing system, including a processing tank for processing substrates, and a drying unit disposed above the processing tank and having an open end and provided with a top cover covering the open end, to make the substrate processing system carry out a substrate processing method including: a loading step of opening the top cover and carrying substrates through the open end of the drying unit into the processing tank; a chemical processing step of chemically processing the substrates with a chemical contained in the processing tank; a processing liquid changing step of replacing the chemical contained in the processing tank with a rinsing liquid; and a drying step of drying the substrates by the drying unit with the open end closed by the top cover; wherein the top cover is removed to open the open end of the drying unit and the drying unit is exhausted of gases during the chemical processing step, and after the chemical contained in the processing tank has been replaced with the rinsing liquid, the open end of the drying unit is covered with the top cover, an inert gas is supplied into the drying unit and the drying unit is exhausted.

According to the present invention, the chemical vapor and the processing gases can be surely purged from the drying unit by forcibly exhausting the drying unit through the second discharge line. The upward flow of the chemical vapor contained in the processing tank into the drying unit can be prevented by supplying fresh air into the drying unit opened into the atmosphere and forcibly exhausting the drying unit through the second discharge line to produce air currents in the drying unit. The drying unit can be effectively purged of gases by supplying the inert gas into the drying unit.

BRIEF DESCRIPTION OF THE DRAWINGS

FIG. 13 is a schematic sectional view of a substrate processing system including a top cover provided with an opening and a lid in a state during a chemical processing process.

BEST MODE FOR CARRYING OUT THE INVENTION

Figure 1:
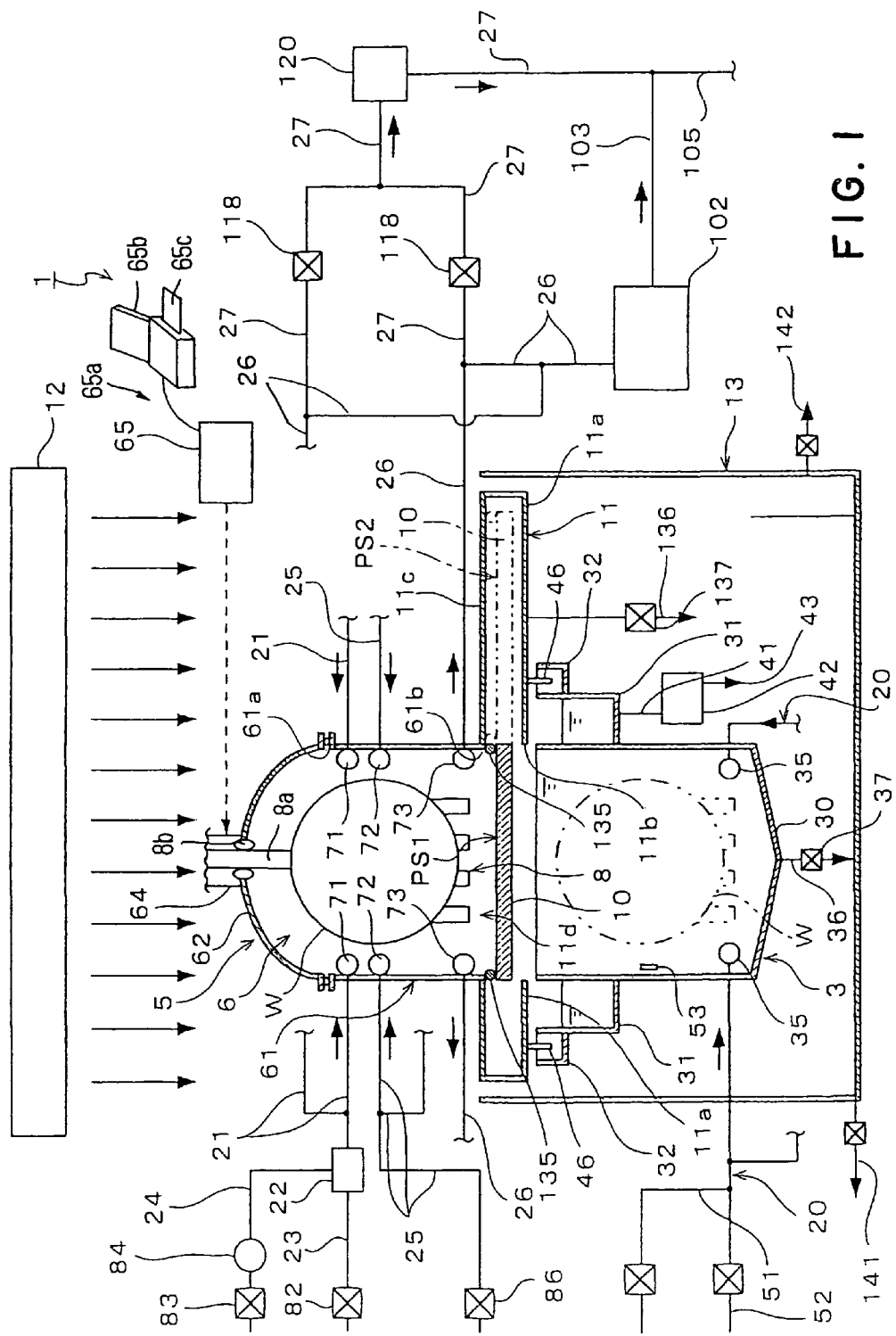
FIG. 1 is a diagrammatic view of a substrate processing system in a preferred embodiment according to the present invention.

Preferred embodiments of the present invention will be described in connection with substrate processing systems capable of cleaning, for example, fifty wafers W in a batch processing mode. Referring to FIG. 1, a substrate processing system 1 in a preferred embodiment according to the present invention includes a processing tank 3 for processing wafers W by a chemical process and a rinsing process and a drying unit 6 including a vessel 5 and disposed above the processing tank 3. The substrate processing system 1 is provided with a wafer carrying device 8 for collectively carrying the fifty wafers W between the processing tank 3 and the drying unit 6. In the processing tank and in the drying unit 6, the fifty wafers W are held by the wafer carrying device 8 in a vertical position with their surfaces extended vertically and are arranged in a direction parallel to the paper as viewed in FIG. 1. The substrate processing system 1 is provided with a shutter 10 for opening the drying unit 6 into and isolating the drying unit 6 from the processing tank 3. The shutter 10 moves in a shutter operating unit 11 disposed between the processing tank 3 and the vessel 5. A filter fan unit (FFU) 12 is disposed above the vessel 5. The FFU 12 generates a down flow of clean air. The processing tank 3 is contained in a box 13

The substrate processing system 1 is provided with a processing liquid supply line 20 for supplying, for example, a DHF, namely, a chemical, and pure water (DIW), namely, a rinsing liquid, into the processing tank 3. The substrate processing system 1 is provided also with a processing gas supply line 21 for supplying a drying gas, such as an IPA vapor prepared by mixing IPA and hot nitrogen gas (hot $N_2$), into the drying unit 6. The processing gas supply line 21 is connected to an IPA vapor generator 22 capable of generating an IPA vapor. An IPA supply line 23 for carrying IPA, and a hot $N_2$ supply line 24, namely, a first inert gas supply line, for carrying the hot $N_2$, namely, an inert gas, heated at a temperature higher than ordinary temperatures are connected to the IPA vapor generator 22. The substrate processing system 1 is provided with a cold $N_2$ supply line 25, namely, a second inert gas supply line, for carrying $N_2$ of an ordinary temperature into the drying unit 6. The substrate processing system 1 is provided with first discharge lines 26 for carrying gases purged from the drying unit 6, and second discharge lines 27 for forcibly discharging gases from the drying unit 6.

The processing tank 3 includes an inner tank 30 for holding the wafers W, a middle tank 31 surrounding the open upper end of the inner tank 30, and an outer tank 32 surrounding the open end of the middle tank 31.

The open upper end of the inner tank 30 is positioned below an opening 11b formed in the bottom wall 11a of the shutter operating unit 11. Processing liquid spouting nozzles 35 are disposed in a lower part of the inner tank 30. The processing liquid supplied through the processing liquid supply line 20 is spouted into the inner tank 30 from the processing liquid spouting nozzles 35. A drain pipe 36 is connected to the bottom of the inner tank 30 to for draining the processing liquid from the inner tank 30. A shutoff valve 37 is placed in the drain pipe 36.

The middle tank 31 receives the processing liquid overflowed the inner tank 30. A drain pipe 41 is connected to the middle tank 31 to drain the processing liquid from the middle tank 31. A trap 41 is placed in the drain pipe 41.

Figure 2:
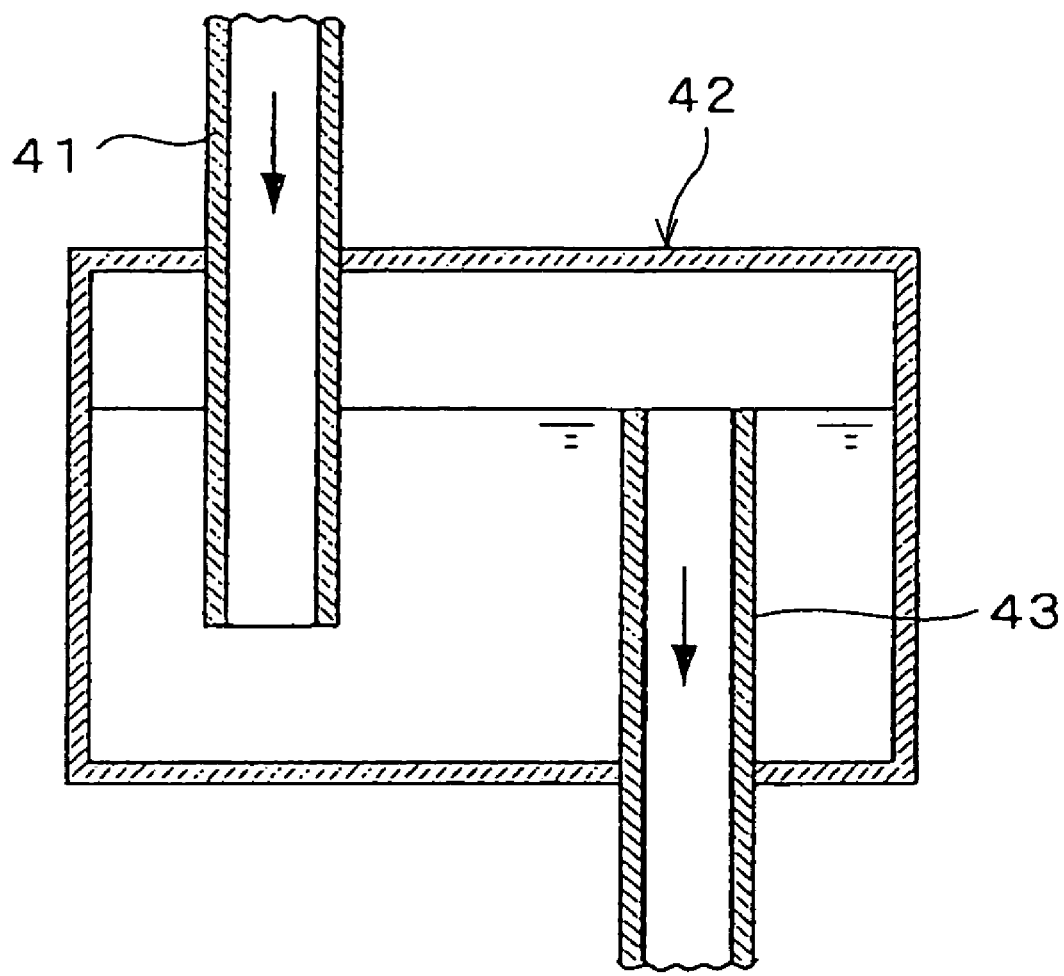
FIG. 2 is a sectional view of a trap incorporated into a processing tank.

Referring to FIG. 2, a drain pipe 43 is connected to the trap 42 to drain the processing liquid from the trap 42 into the box 13. In the trap 42, the upper end of the drain pipe 43 is at a level above that of the lower end of the drain pipe 41. The waste liquid discharged from the drain pipe 41 into the trap 42 is contained in the trap 42. After the level of the surface of the waste liquid contained in the trap 42 has risen above the level of the upper end of the drain pipe 43, the waste liquid starts dripping through the drain pipe 43. Gases are accumulated in a space spreading over the waste liquid contained in the trap 42. The lower end of the drain pipe 41 is always immersed in the waste liquid and, consequently, gasses accumulated in the drain pipe 43 and the box 13 are prevented from flowing into the drain pipe 41. For example, suppose that the wafers W are processed by a chemical processing process using DHF contained in the inner tank 30, and then the wafers W are rinsed by a rinsing process using pure water supplied into the inner tank 30. A chemical vapor generated through the evaporation of the waste liquid contained in the box 13 is prevented from flowing through the drain pipe 41 into the processing tank 3.

Referring to FIG. 1, the outer tank 32 always contains pure water. An annular sealing plate 46 has an upper end in close contact with the lower surface of the bottom wall 11a of the shutter operating unit 11 disposed over the outer tank 32, and a lower part immersed in the pure water contained in the outer tank 42. Thus the outer tank 32 containing the pure water has a sealing function to prevent an atmosphere in the processing tank 3 from leaking outside.

A hydrofluoric acid supply line (HF supply line) 51 for carrying hydrofluoric acid (HF) and pure water supply line 52 for carrying pure water are connected to the processing liquid supply line 20. To prepare DHF of a predetermined HF concentration in the inner tank 30, pure water is supplied first through the pure water supply line 52 into the inner tank 30, and then HF is supplied through the HF supply line 51 into the inner tank 30. A concentration meter 53 is placed in the inner tank 30 to measure the HF concentration of the DHF contained in the inner tank 30.

Figure 3:
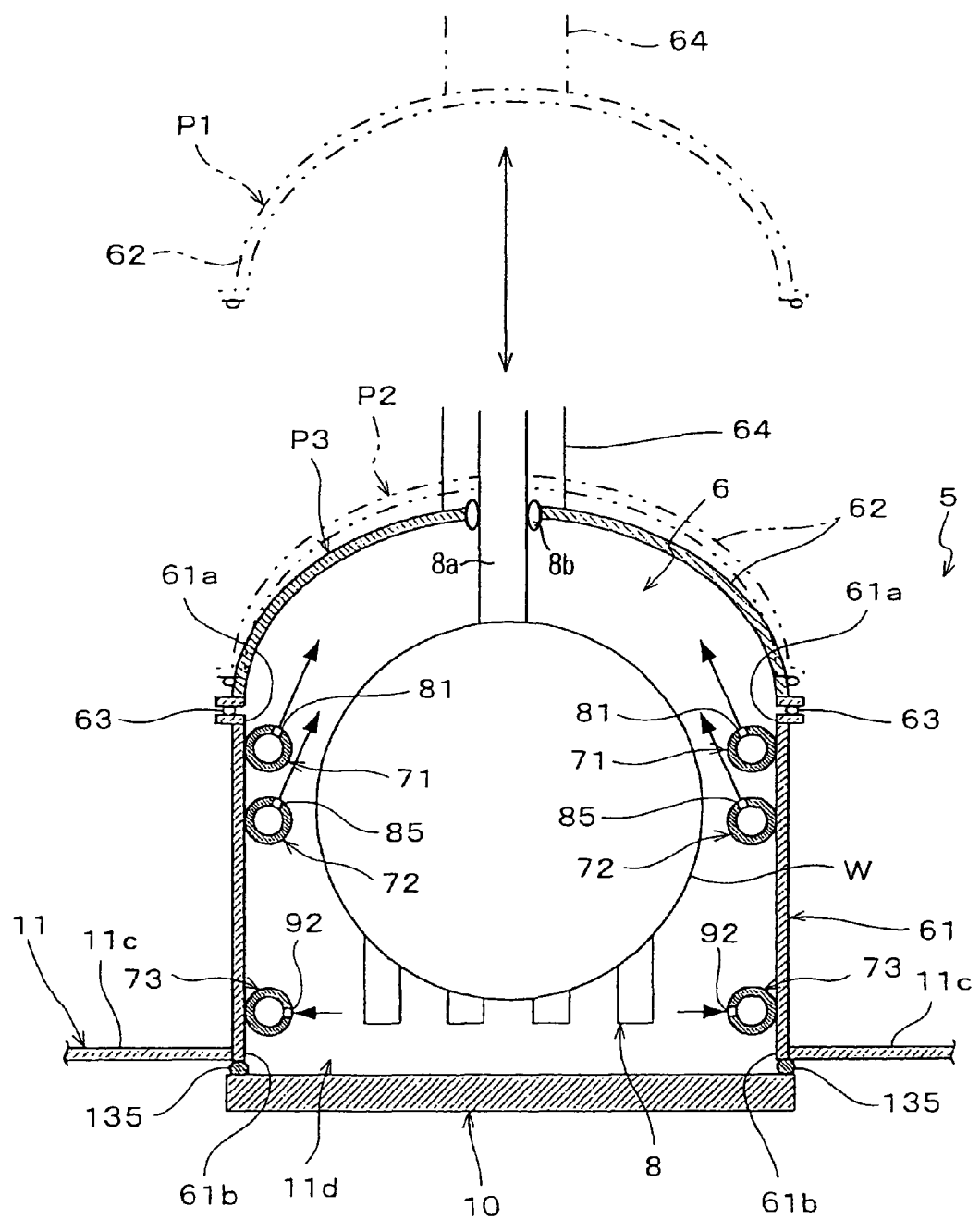
FIG. 3 is a sectional view of a drying unit.

Referring to FIG. 3, the vessel 5 has a vessel body 61 having an open upper end 61a and an open lower end 61b, and a top cover 62 for covering the open upper end 61a of the vessel body 61. The open lower end 61b of the vessel body 61 opens to an opening 11d formed in the top wall 11c of the shutter operating unit 11. The wafers W are carried from outside the substrate processing system 1 into the drying unit 6 through the open upper end 61a of the vessel body 61. When the open upper end 61 of the vessel body 61 is covered with the top cover 62, an O ring 63 is held between the open upper end 61a and the top cover 62 to seal the drying unit 6 hermetically.

The inside surface of the top cover 62 has an upward convex, substantially semicircular cross section. The top cover 62 is supported by a cover lifting device 64 for vertically moving the top cover 62. A controller 65 controls the operation of the cover lifting device 64. The cover lifting device 64 is controlled by the controller 65 to position the top cover 62 at one of an open position P1 for opening the vessel body 61 to carry the wafers W into and out of the vessel body 61, a half-open position P2 for forming a gap between the top cover 62 and the open upper end 61a of the vessel body 61 to process the wafers W and a closed position P3 for closing the open upper end of 61a of the vessel body 61. When the top cover 62 is moved to the open position P1 or the half-open position P2, the drying unit 6 is opened into the atmosphere (outside atmosphere). When the top cover 62 is moved to the closing position P3, the drying unit 6 is isolated from the atmosphere. When the top cover 62 is placed at the open position P1, a gap sufficiently large to carry the wafers W into and out of the vessel body 61 is formed between the open upper end 61a of the vessel body 61 and the lower end of the top cover 62. When the top cover 62 is at the half-open position P2, the distance between the open upper end 61a and the lower end of the top cover is shorter than that formed when the top cover 62 is at the open position P1.

The open upper end 61a is opened to open the drying unit 6 to the atmosphere (outside atmosphere) in a state where DHF is contained in the processing tank 3, such as a state for the chemical processing process or the liquid changing process for replacing DHF with pure water. When gases are discharged forcibly from the drying unit 6 through the second discharge line 27 with the drying unit 6 opened into the atmosphere, clean air supplied by the FFU 12 can flow into the drying unit 6 to produce currents of clean air in the drying unit 6. The currents of clean air prevent the atmosphere of DHF from flowing upward into the drying unit 6. It is preferable to place the top cover 62 at the half-open position P2 during the chemical processing process and the liquid changing process. When the drying unit 6 executes the drying process using the IPA vapor, the open upper end 61a is closed to isolate the drying unit 6 from the atmosphere to prevent the leakage of the IPA vapor from the drying unit 6.

Two processing gas spouting nozzles 71 are disposed in the vessel body 61 on the right and the left side of the vessel body 61, respectively. The IPA vapor and the hot $N_2$ supplied through the processing gas supply line 21 are supplied to the processing gas spouting nozzles 71. Cold $N_2$ spouting nozzles 72 for spouting cold $N_2$ supplied through the cold $N_2$ supply line 25 are disposed below the processing gas spouting nozzles 71, respectively. Two discharge pipes 73 are disposed on the right and the left side of a lower part of the vessel body 61. The discharge pipes 73 are connected to the first discharge lines 26 and the second discharge lines 27, respectively.

Figure 4:
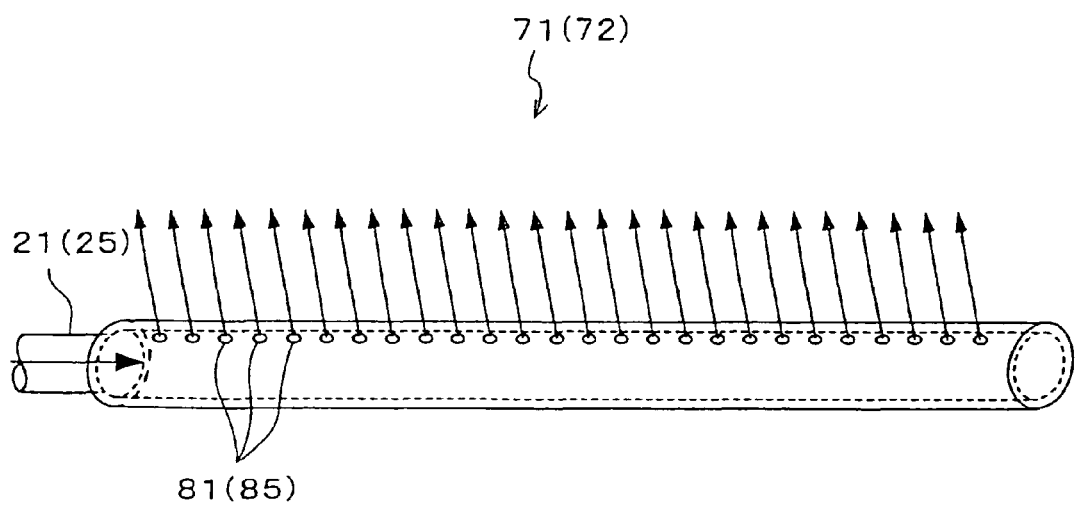
FIG. 4 is a perspective view of a processing gas supply nozzle (a $N_2$ supply nozzle)

Referring to FIG. 4, each of the processing gas spouting nozzles 71 is provided with a plurality of outlets 81 through which the IPA vapor or the hot $N_2$ is spouted. The outlets 81 are arranged longitudinally (laterally as viewed in FIG. 4) in a single row. As shown in FIG. 3, the outlets 81 of the processing gas spouting nozzles 71 are directed so as to spout the IPA vapor or the hot $N_2$ upward so that the IPA vapor or the hot $N_2$ may not be spouted directly on the surfaces of the wafers W held in the drying unit 6. The IPA vapor or the hot $N_2$ spouted through the outlets 81 of the processing gas spouting nozzles 71 flows upward through a space on the right or the left side of the wafers W toward the inside surface of the top cover 62. The IPA vapor or the hot $N_2$ spouted through the right and the left processing gas spouting nozzles 71 are mixed together in a space under a central part of the top cover 62, and a mixture of the IPA vapor and the hot $N_2$ flows into spaces between the wafers W and flows downward along the surfaces of the wafers W.

As shown in FIG. 1, the processing gas supply line 21 is connected to the processing gas spouting nozzles 71 and to the IPA vapor generator 22. The IPA supply line 23 for carrying IPA and the hot $N_2$ supply line 24 are connected to the IPA vapor generator 22. A shutoff valve 82 is placed in the IPA supply line 23. A shutoff valve 83 and a flow controller 84 are placed in the hot $N_2$ supply line 24. The flow controller 84 regulates the flow of the hot $N_2$ in the $N_2$ supply line 24.

The IPA vapor generator 22 mixes the IPA supplied thereto through the IPA supply line and the hot $N_2$ supplied thereto through the hot $N_2$ supply line 24 to generate the IPA vapor. The thus generated IPA vapor is supplied from the IPA vapor generator 22 through the processing gas supply line 21 to the processing gas spouting nozzles 71. The IPA vapor is spouted through the processing gas spouting nozzles into the drying unit 6. Only the hot $N_2$ supplied through the hot $N_2$ supply line 24 can be supplied through the IPA vapor generator 22, the processing gas supply line 21 to the processing gas spouting nozzles 71 and can be spouted through the processing gas spouting nozzles 71 into the drying unit 6 by closing the shutoff valve 82 to stop supplying IPA through the IPA supply line 23 and opening the shutoff valve 83. The temperature of the processing gas supply line 21 can be raised by thus passing the hot $N_2$ through the processing gas supply line 21 before supplying the IPA vapor through the processing gas supply line 21.

Referring to FIG. 4, each of the cold $N_2$ spouting nozzles 72, similarly to the processing gas spouting nozzles 71, is provided with a plurality of outlets 85 through which the cold $N_2$ is spouted. The outlets 85 are arranged longitudinally in a single row. As shown in FIG. 3, the outlets 85 of the cold $N_2$ spouting nozzles 72 are directed upward so that the cold $N_2$ may not be spouted directly on the surfaces of the wafers W held in the drying unit 6. The cold $N_2$ spouted through the outlets 85 of the cold $N_2$ spouting nozzles 72 flows upward through a space on the right or the left side of the wafers W toward the inside surface of the top cover 62. The cold $N_2$ spouted through the right and the left cold $N_2$ spouting nozzles 72 are mixed together in a space under a central part of the top cover 62, and the cold $N_2$ flows into spaces between the wafers W and flows downward along the surfaces of the wafers W.

Referring to FIG. 1, the $N_2$ supply line 25 is connected to the cold $N_2$ spouting nozzles 72. A shutoff valve 86 is placed in the $N_2$ supply line 25.

Figure 5:
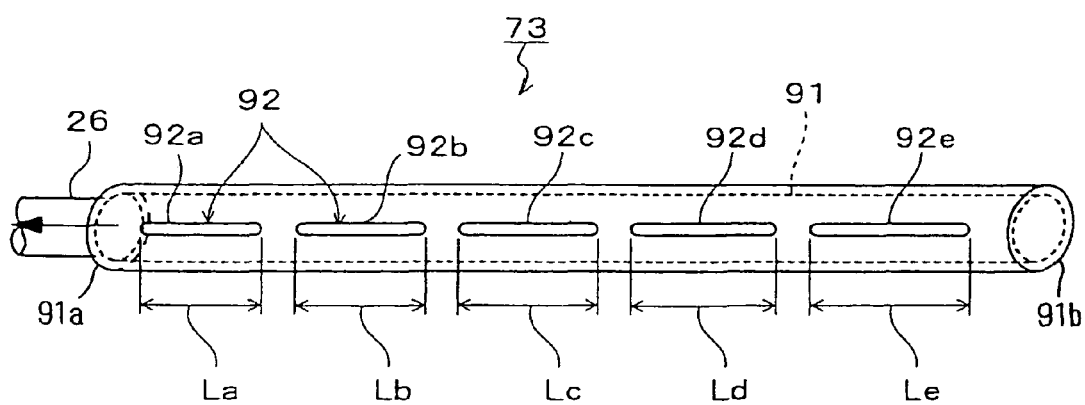
FIG. 5 is a perspective view of an exhaust nozzle.

Referring to FIG. 5, each of the discharge pipes 73 defines a cylindrical discharge passage 91 having a base end 91a, and a free end 91b in the drying unit 6. The first discharge lines 26 are connected to the base ends 91a of the discharge passages 91. The second discharge lines 27 are connected to the first discharge lines 26. The discharge pipe 73 is provided with a plurality of inlet slits 92a, 92b, 92c, 92d and 9e, which, in some cases, will be inclusively indicated at 92, for example, five inlet slits 92a to 92e. The inlet slits 92a, 92b, 92c, 92d and 92e are arranged in that order in a line extending in a direction from the base end 91a to the free end 91b of the discharge passage 91. The inlet slits 92 facilitate the flow of waste gases through the inlet slits 92 into the discharge passage 91 and enables efficient discharge of waste gases. The inlet slits 92a to 92e nearer to the base end 91a have smaller sectional areas and those nearer to the free end 91b have larger sectional areas. Waste gases sucked into the discharge passage 91 flow smoothly into the first discharge lines 26 for efficient discharge and thereby the waste gases are discharged at a high discharge rate. The lengths along the discharge passage 91 of the inlet slits 92a to 92e nearer to the free end 91b of the discharge passage 91 are longer. The respective lengths La, Lb, Lc, Ld and Le of the inlet slits 92a, 92b, 92c, 92d and 92e increase in that order. As shown in FIG. 3, the discharge pipes 73 are disposed such that the inlet slits 92 are arranged along the length of the vessel body 61 and waste gases flow horizontally into the inlet slits 92.

As shown in FIG. 1, a drain box 102 is connected to the outer end of the first discharge lines 26 connected to the right and the left discharge pipe 73. An exhaust pipe 103 is connected to the drain box 102 to exhaust the drain box 102. The exhaust pipe 103 is connected to an exhaust system 105 of the plant.

The second discharge lines 27 are connected to middle parts of the first discharge lines 26 connected to the right and the left discharge pipes 73, respectively. Shutoff valves 118 are placed in the second discharge lines 27, respectively. The second discharge lines 27 extending below the shutoff valves 118 are joined into the single second discharge line 27. The single second discharge line 27 is connected to an ejector 120 connected to the exhaust system 105 of the plant.

The shutoff valves 118 are closed, IPA vapor, hot $N_2$ or cold $N_2$ is supplied into the drying unit 6 to discharge the atmosphere in the drying unit 6 through the inlet slits 92 of the discharge pipes 73 and the first discharge line 26. The shutoff valves 118 are opened and the ejector 120 is operated to purge the drying unit 6 forcibly; the atmosphere in the drying unit 6 is discharged through the suction nozzles 73, the first discharge lines 26 and the second discharge lines 27. When the discharge lines 27 are used in addition to the discharge lines 26, the atmosphere in the drying unit 6 can be forcibly discharged at a discharge rate higher than that at which the atmosphere can be discharged only through the discharge lines 26.

Figure 6:
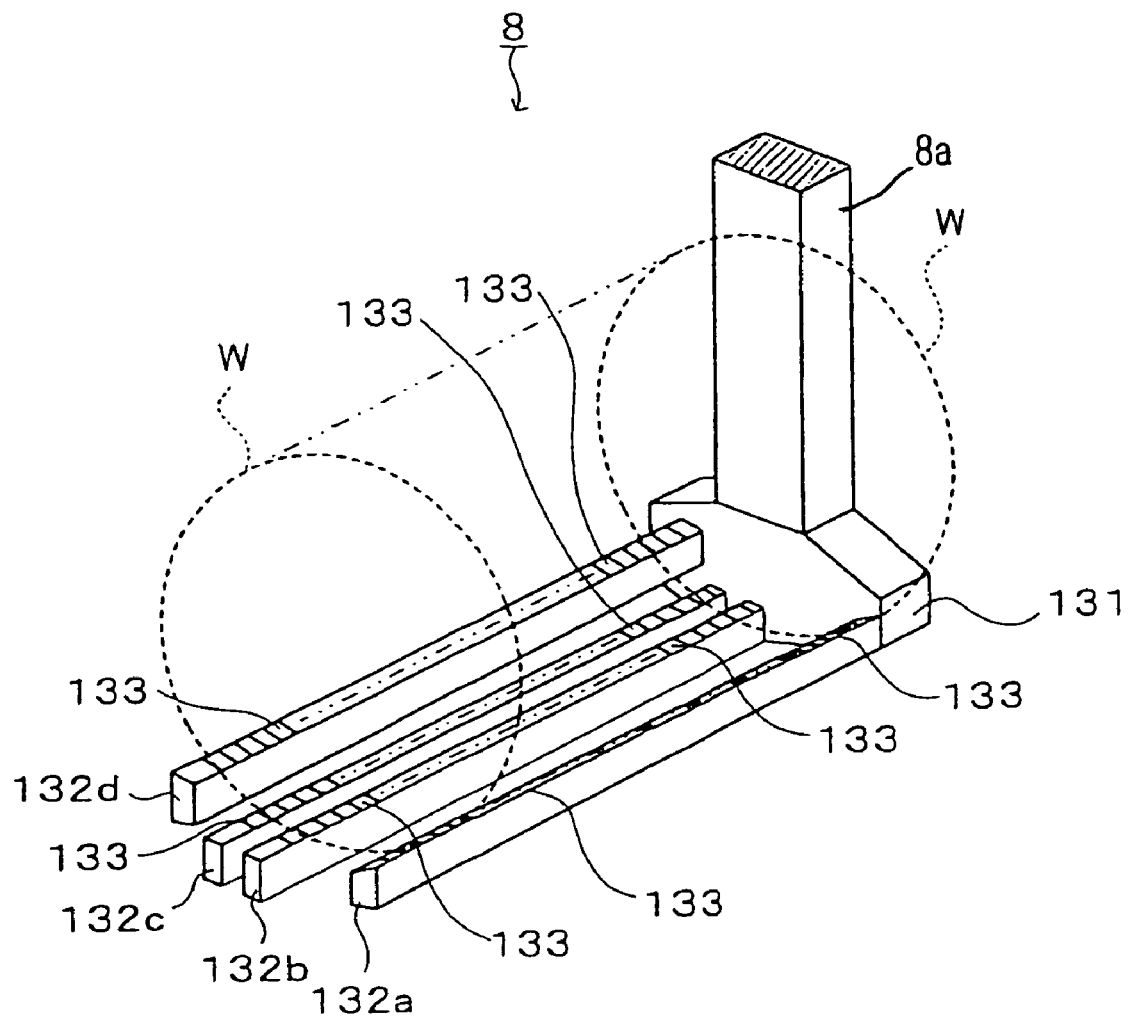
FIG. 6 is a perspective view of a wafer guide.

The waver carrying device 8 can be vertically moved. As shown in FIG. 6, the wafer carrying device 8 includes a holding member 131, and four parallel support members 132a, 132b, 132c and 132d fixedly attached to the holding member 131 in a horizontal position. Fifty grooves 133 each for receiving a peripheral part of a wafer W are formed at equal pitches in each of the four support members 132a to 132d. The fifty wafers W are supported at equal intervals on the support members 132a to 132d.

A lifting bar 8a is connected to the holding member 131 of the wafer carrying device 8. The lifting bar extends vertically through the top cover 62. The gap between the lifting bar 8a and the top cover is sealed with an air grip seal 8b during a drying process. The lifting bar 8a is moved vertically to move the wafers between the processing tank 3 and the drying unit 6.

Referring to FIG. 1, the open lower end 61b of the vessel body 61 opens to the opening 11b formed in the bottom wall 11a of the shutter operating unit 11. The opening 11d formed in the top wall 11c of the shutter operating unit 11 is opposite the open upper end 61a of the vessel body 61. A sealing member 135 is attached to a peripheral part of the upper surface of the shutter 10. The sealing member 135 seals the gap between the edge of the opening 11d of the shutter operating unit 11 and the peripheral part of the shutter 10. The shutter 10 is driven by a driving mechanism, not shown, for vertical and horizontal movements in the shutter operating unit 11. The shutter 10 can be moved to a closing position PS1 as indicated by continuous lines in FIG. 1 between the openings 11b and 11d to close the opening 11b and to a home position PS2 as indicated by two-dot chain lines in FIG. 1 apart from the space between the openings 11b and 11d the shutter 10 is moved to the home position PS2 when the wafers W held by the wafer carrying device 8 is moved vertically between the processing tank 3 and the drying unit 6. When the shutter 10 is moved to the closing position PS1, the sealing member 135 is pressed in close contact with edge of the opening 11d to isolate the atmosphere in the drying unit 6 from an atmosphere in the shutter operating unit 11.

A discharge line 136 is connected to a part, below the shutter 10 at the original position PS2, of the bottom wall 11a of the shutter operating unit 11. Waste liquids and waste gases are discharged from the shutter operating unit 11 through the discharge line 136. Liquid drops adhered to the shutter 10 and dropped onto the bottom wall 11a of the shutter operating unit 11, an internal atmosphere of DHF and IPA vapor are discharged from the shutter operating unit 11 through the discharge line 136. A shutoff valve 137 is placed in the discharge line 136.

A drain line 141 and a discharge line 142 are connected to the box 13. Waste liquids are drained through the drain pipe 36 connected to the inner tank 30, the drain pipe 43 connected to the middle tank 31 the discharge line 136 connected to the shutter operating unit 11 into the box 13, and then the waste liquids are drained through the drain line 141 into the waste liquid disposal system of the plant.

The functional components of the substrate processing system are connected by signal lines to a control computer 65a include in a controller for the automatic control of the operations of the substrate processing system. The functional components include all those for carrying out operations to execute predetermined process conditions, such as the cover lifting device 64, the wafer carrying device 8, the shutter operating unit 11, the IPA vapor generator 22, the injector 120 and such. Typically, the control computer 65a is a general-purpose computer capable of executing desired functions specified by software.

The control computer 65a includes a control unit 65, such as a central processing unit (CPU), an I/O unit 65b connected to the control unit 65, and a recording medium 65c storing control software and capable of being loaded into the I/O unit 65b. The control computer 65a executes the control software to control the functional components of the substrate processing system to realize process conditions, such as the opening of the top cover, defined by a predetermined process recipe.

The recording medium 65c may be such as capable of being permanently installed in the control computer 65a or capable of being detachably loaded into reader included in the control computer 65a and storing information that can be read by the reader. Typically, the recording medium 65c is a hard disk storing control software that can be read by a hard disk drive. The recording medium 65c may be a removable disk storing control software, such as a CD-ROM or a DVD-ROM. Data recorded on such a removable disk is read by an optical reader included in the control computer 65a. The recording medium 65c may be either a RAM (random-access memory) or a ROM (read-only memory). The recording medium 65c may be a cassette type ROM. In a word, the recording medium 65c may be any suitable one of recording mediums known in the field of computer technology. In a plant provided with a plurality of substrate processing systems each including a control computer, the control software may be installed in a host computer for collectively controlling the control computers of the substrate processing systems. In this case, those substrate processing systems are controlled to execute predetermined processes by the host computer by control signals transmitted thereto through communication lines.

A cleaning method to be carried out by the substrate processing system of the foregoing constitution will be explained.

Figure 7:
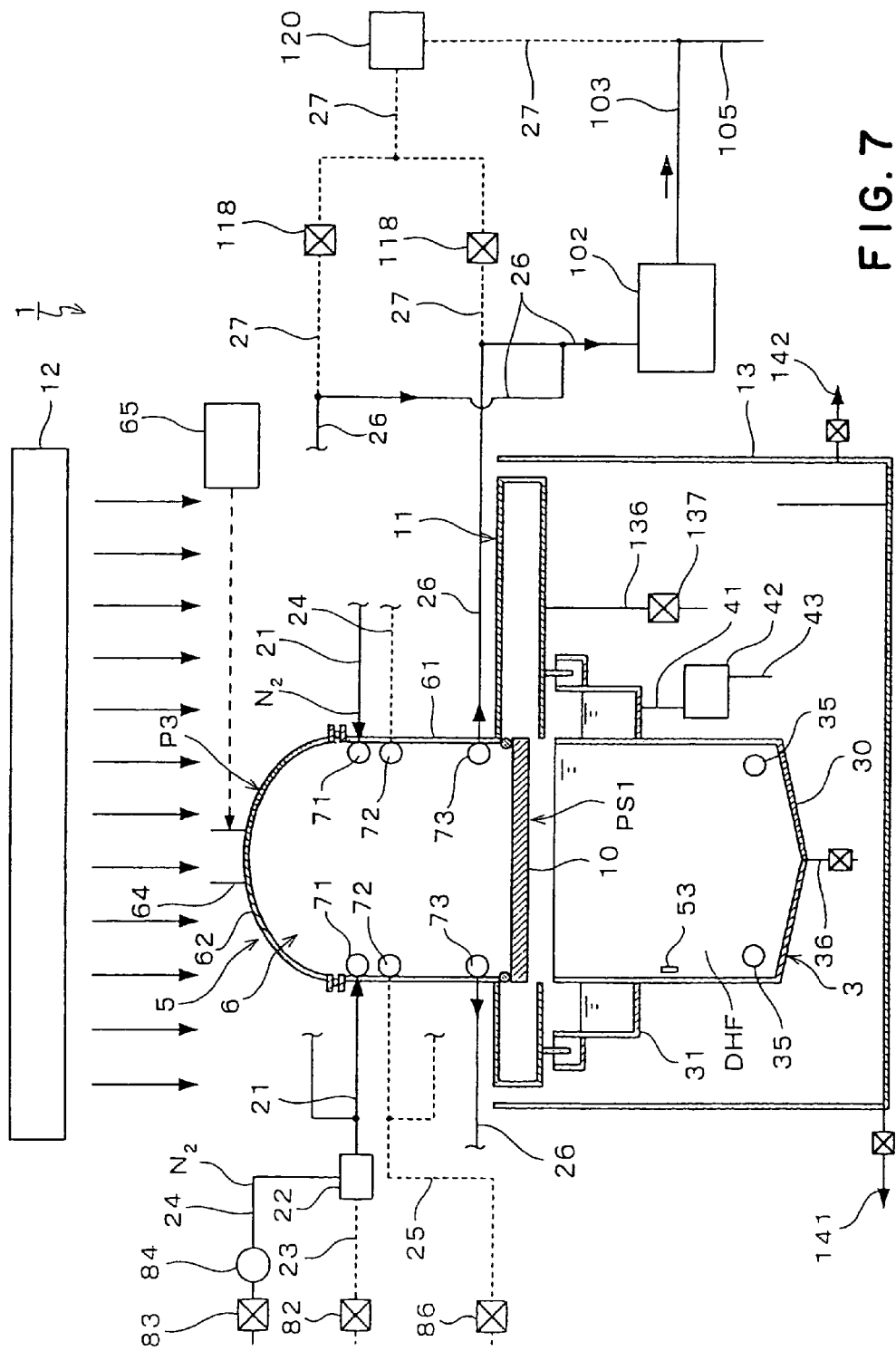
FIG. 7 is a diagrammatic view of the substrate processing system in a state before being loaded with a wafer.

In a waiting state before the wafers W are loaded into the substrate processing system 1, the top cover 62 is held at the closed position P3 and the shutter 10 is held at the closing position PS1 as shown in FIG. 7. Hot $N_2$ is supplied through the hot $N_2$ supply line 24 at a low flow rate and the IPA vapor generated by the IPA vapor generator 22 is supplied through the processing gas supply line 21 and the processing gas spouting nozzles 71 into the drying unit 6. The drying unit 6 is so set that the drying unit 6 can be purged of the atmosphere in the drying unit 6 through the discharge pipes 73 and the first discharge line 26. DHF of a predetermined DHF concentration is contained in the processing tank 3. A desirable flow rate of the hot $N_2$ in the hot $N_2$ supply line 24 is, for example, on the order of 15 l/min.

Figure 8:
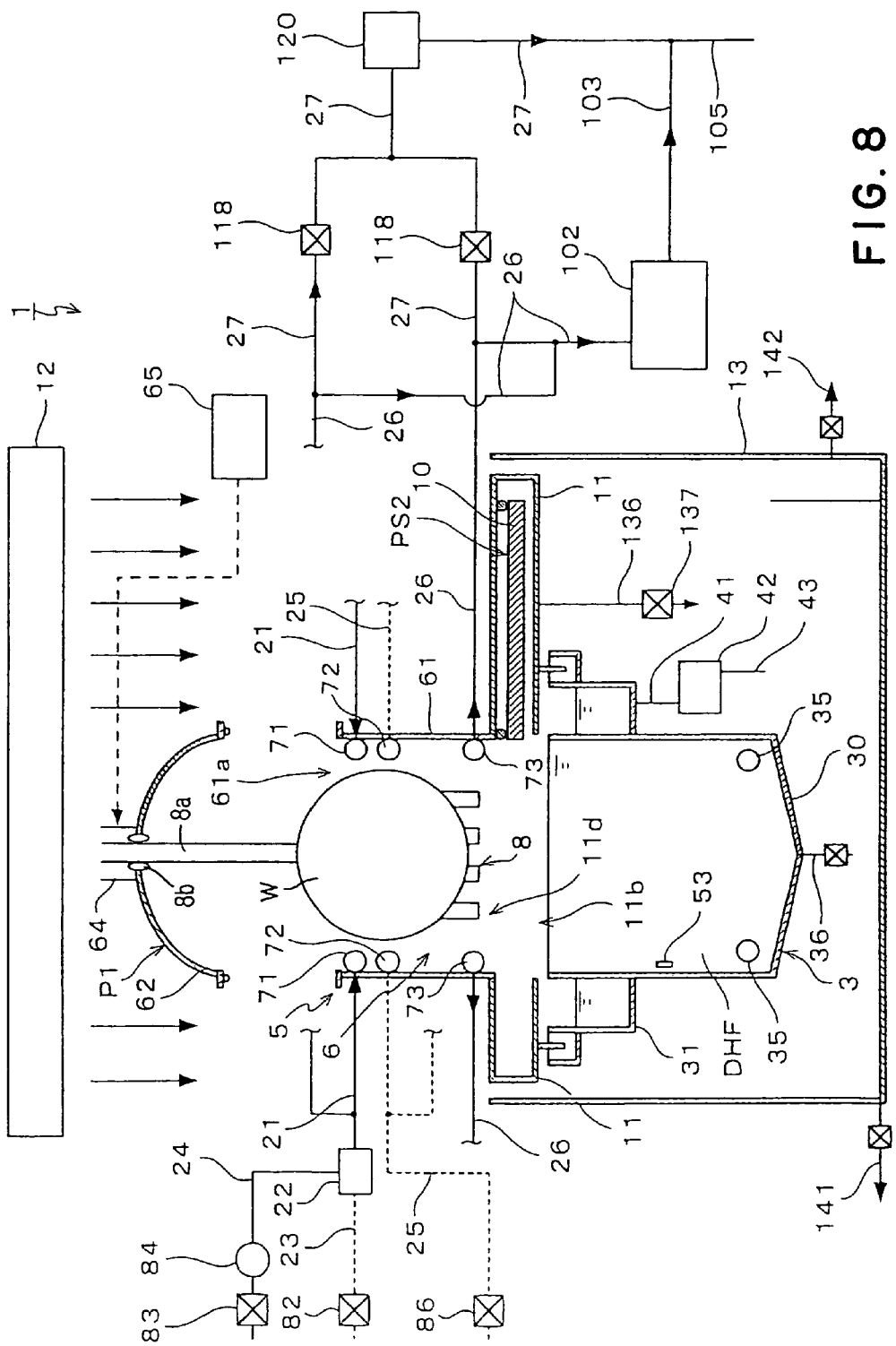
FIG. 8 is a diagrammatic view of the substrate processing system in a state during a wafer loading operation.

Referring to FIG. 8, the top cover 62 is moved to the open position P1 before carrying the wafers W into the substrate processing system 1, and then wafers W, for example, fifty wafers W are carried through the open upper end 61a of the vessel body 61 into the vessel body 61 and be held by the water carrying device 8. The shutter 10 is moved to the home position PS2 to open the openings 11b and 11c of the shutter operating unit 11. The shutoff valves 118 placed in the second discharge lines 27 are opened and the ejector 120 is operated. Thus the drying unit 6 is forcibly purged of gases through the discharge pipes 73, the first discharge lines 26 and the second discharge lines 27. Then, clean air supplied by the FFU 12 flows into the drying unit 6 to produce currents of the clean air flowing from the open upper end 61a toward the discharge pipes 73 in the drying unit 6. The currents of clean air prevents the atmosphere of DHF produced by DHF contained in the processing tank 3 from flowing upward into the drying unit 6 even if the shutter 10 is opened. Thus the atmosphere of DHF is prevented from adhering to the inside surface of the vessel 5 and from leaking outside through the open upper end 61a of the vessel 5. Gases can be smoothly sucked through the inlet slits 92a to 92e into the discharge pipes 73 even if the gases are discharged at a high discharge rate for forced discharge.

Figure 9:
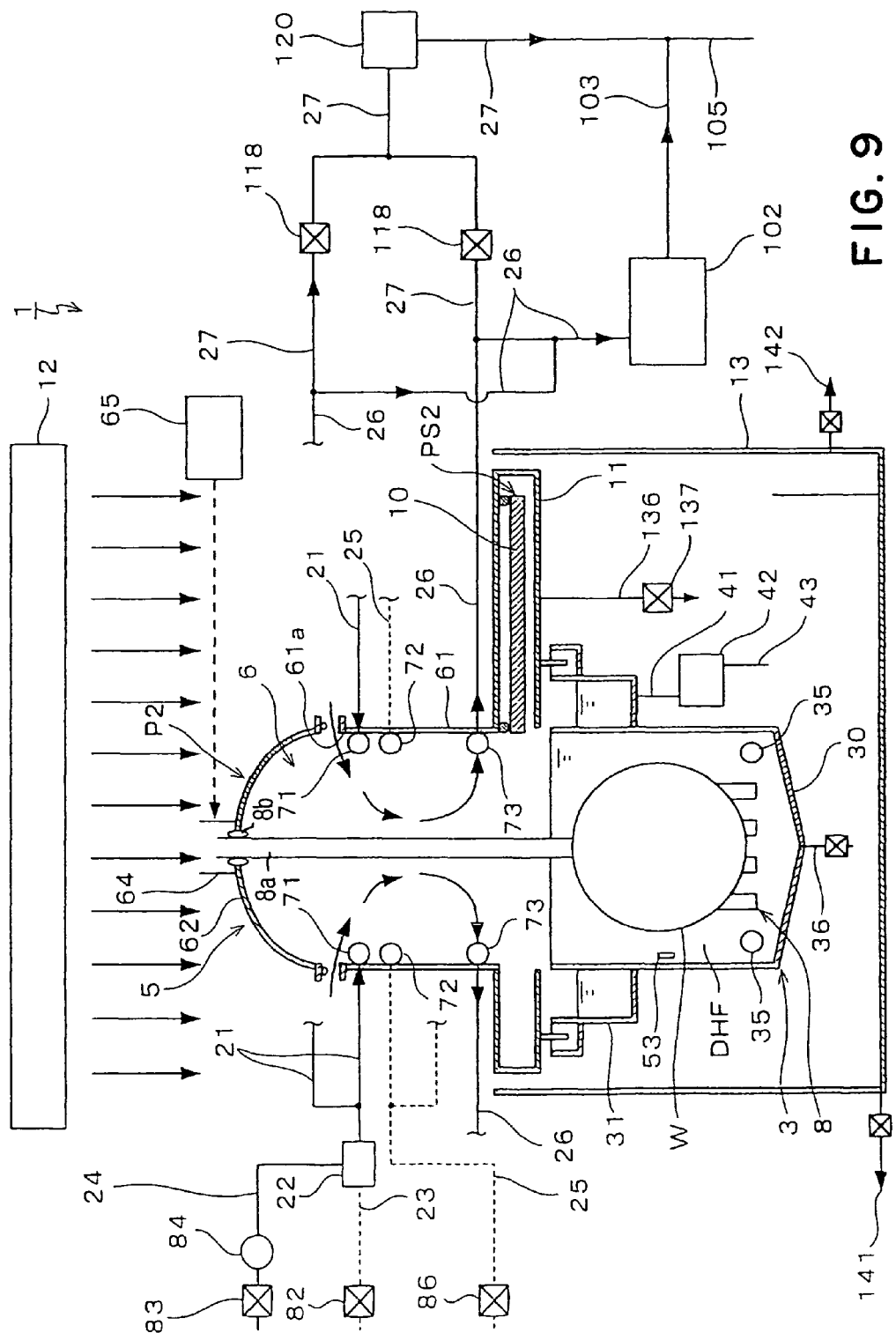
FIG. 9 is a diagrammatic view of the substrate processing system in a state during a chemical processing operation.
Figure 10:
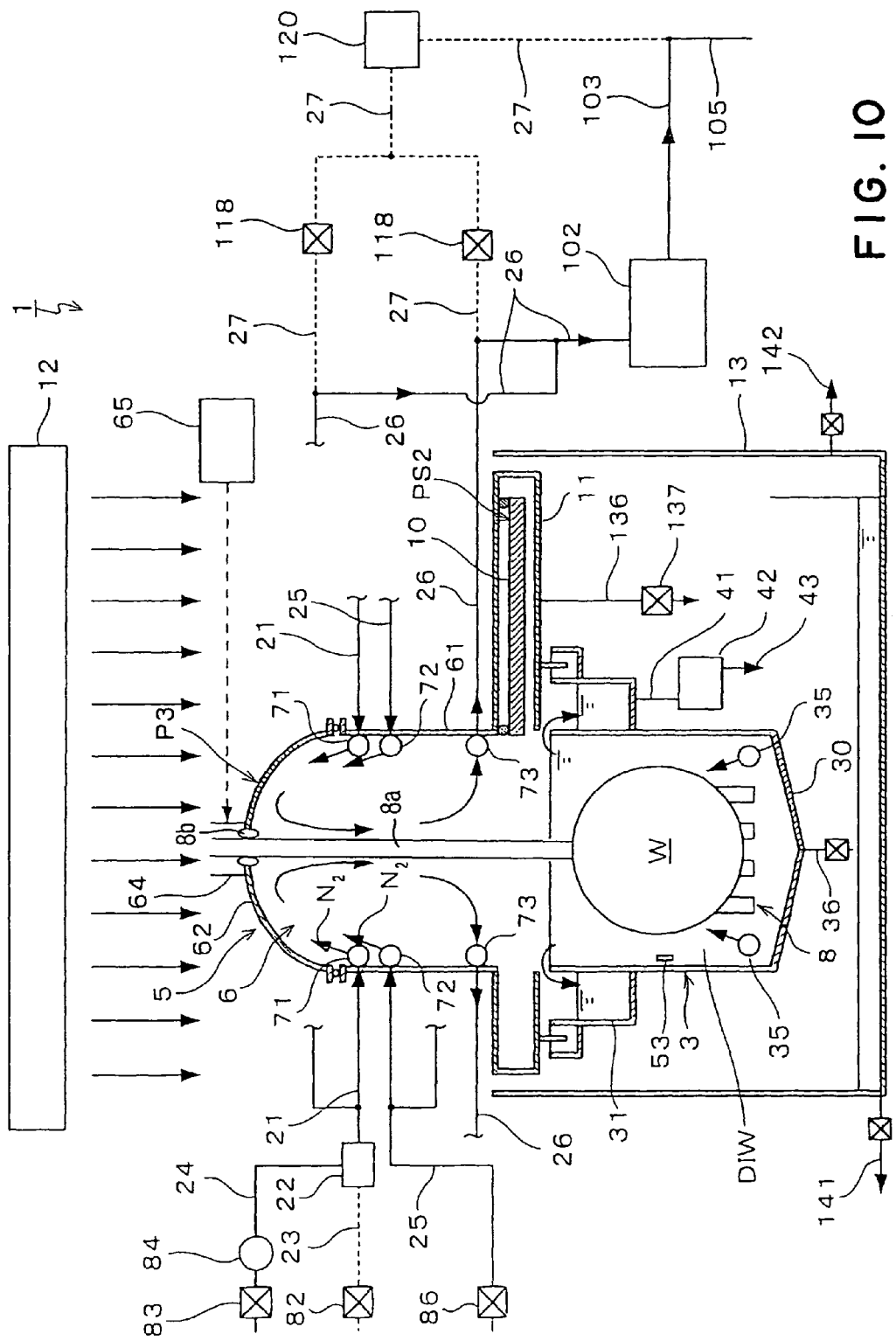
FIG. 10 is a diagrammatic view of the substrate processing system in a state after the replacement of DHF with pure water.

The wafer carrying device 8 is moved down from the drying unit 6 into the inner tank 30 of the processing tank 3 to immerse the wafers W in the DHF contained in the inner tank 30, and then the wafers W are subjected to the chemical process. While the wafers W are processed by the chemical process in the processing tank 3, the top cover 62 is moved to the half-closed position P2 to form a gap between the lower end of the top cover 62 and the open upper end 61a of the vessel body 61 as shown in FIG. 9. Operations similar to those implemented when the wafers W are carried into the vessel body 61, are implemented to open the shutoff valves 118 placed in the second discharge lines 27, to operate the ejector 120 to purge forcibly the drying unit 6 through the second discharge lines 27. Thus the down flow of the clean air supplied by the FFU 12 flows through the gap between the top cover 62 and the open upper end 61a into the drying unit 6 and, consequently, currents of the clean air flowing from the open upper end 61a toward the discharge pipes 73 are produced. Thus the upward flow of the DHF atmosphere in the processing tank 3 into the drying unit 6 can be prevented. Thus the atmosphere of DHF is prevented from adhering to the inside surface of the vessel 5 and from leaking outside through the open upper end 61a of the vessel 5. The production of the currents of the clean air supplied by the FFU 12 in the drying unit 6 is economically advantageous.

After the chemical process using the DHF for processing the wafers W has been completed, pure water is spouted into the inner tank 30 holding the wafers W therein through the processing liquid spouting nozzles 35. Thus the DHF contained in the inner tank 30 is replaced with the pure water to rinse the wafers W with the pure water. The DHF and the pure water overflowed the inner tank 30 are collected in the middle tank 31 and is drained through the drain pipe 41.

While the DHF contained in the inner tank 30 is being replaced with the pure water, the top cover 62 is held at the half-open position P2, where the top cover 62 is held during the chemical process, gases are discharged continuously through the second discharge lines 27 for forced discharge, and currents of the clean air supplied by the FFU 12 flow from the open upper end 61a toward the discharge pipes 73 in the drying unit 6. Consequently, the atmosphere of DHF in the processing tank 3 is prevented from flowing upward into the drying unit 6. After the DHF contained in the inner tank 30 has been completely replaced with the pure water and the DHF has been removed from the processing tank 3, the top cover 62 is moved to the closed position P3 to close the open upper end 61a of the vessel body 61 hermetically. Whether or not the DHF contained in the processing tank 3 has been completely replaced with the pure water can be determined on the basis of a measured DHF concentration measured by the concentration meter 53. It is preferable to move the top cover 62 to the closed position P3 after the complete replacement of the DHF with the pure water on the basis of a measured DHF concentration measured by the concentration meter 53, is confirmed.

After the DHF contained in the processing tank 3 has been replaced with the pure water, the shutoff valves 118 placed in the second discharge lines 27 are closed to stop the forced discharge through the second discharge line 27. Thus gases are discharged from the drying unit 6 at a discharge rate lower than that at which gases are discharged (i) while the wafers W are carried into the substrate processing system 1 and are moved into the processing tank 3, (ii) while the chemical process is carried out and (iii) while the DHF contained in the processing tank 3 is being replaced with the pure water. At the same time, $N_2$ can be supplied at a high supply rate by simultaneously supplying both hot $N_2$ and cold $N_2$ respectively through the hot $N_2$ supply line 24 and the cold $N_2$ supply line 25. Preferably, the shutoff valves 118 placed in the second discharge lines 27 are closed and the shutoff valve 83 placed in the hot $N_2$ supply line 24 and the shutoff valve 86 placed in the cold $N_2$ supply line 25 are opened after the confirmation of the complete replacement of the DHF with the pure water on the basis of a measured DHF concentration measured by the concentration meter 53. The hot $N_2$ and the cold $N_2$ are supplied into the drying unit 6 through the processing gas spouting nozzles 71 and the cold $N_2$ spouting nozzles 72, respectively. The hot $N_2$ and the cold $N_2$ supplied into the drying unit 6 flow upward toward an upper part of the inside surface of the top cover 62, and then flows down from the top part of the inside surface of the top cover 62 through the drying unit 6. The atmosphere in the drying unit 6 is forced to flow through the inlet slits 92 into the discharge pipes 73 and is discharged through the first discharge lines 26. Thus the atmosphere in the drying unit 6 is replaced with an atmosphere of $N_2$ by supplying the hot $N_2$ and the cold $N_2$ into the drying unit 6 to discharge the atmosphere in the drying unit 6 through the first discharge lines 26. A preferable flow rate of the hot $N_2$ in the hot $N_2$ supply line 24 is, for example, on the order of 100 l/min and a preferable flow rate of the cold $N_2$ in the cold $N_2$ supply line 25 is, for example, on the order of 200 l/min. Since the inlet slits 92a to 92e of the discharge pipes 73 nearer to the free ends of the discharge pipes 73 have greater area, gases can be efficiently forced to flow through the inlet slits 92a to 92e into the discharge pipes 73 even if the hot $N_2$ and the cold $N_2$ are supplied at high flow rates, respectively.

Hot $N_2$ supplied through the hot $N_2$ supply line 24 flows through the IPA vapor generator 22 and the processing gas supply lines 21 into the processing gas spouting nozzles 71. Consequently, the processing gas supply lines 21 are heated by the hot $N_2$. Thus the temperature of the IPA vapor flowing through the processing gas supply lines 21 is prevented from dropping when the IPA vapor is supplied after the completion of the rinsing process using pure water. Since the temperature of the inside of the drying unit 6 is raised by the hot $N_2$, the adhesion of the IPA vapor on the inside surface of the drying unit 6 can be suppressed when the IPA vapor is supplied after the completion of the rinsing process using pure water. Consequently, the IPA vapor can be efficiently used for processing the wafers W and thereby the consumption of IPA vapor can be reduced.

The shutoff valve 137 is kept open while the wafers W are being carried into the vessel body 61, while the wafers W are being processed by the chemical process and while the DHF contained in the inner tank 30 is being replaced with pure water to discharge the atmosphere of DHF in the shutter operating unit 11 through the discharge line 136. Consequently, clean air supplied by the FFU 12 is able to flow through the drying unit 6 into the shutter operating unit 11 to prevent the atmosphere of DHF from remaining in the shutter operating unit 11. The shutoff valve 137 may be closed to stop discharging the atmosphere of DHF through the discharge line 136 after the DHF contained in the inner tank 30 has been replaced with pure water and the processing tank 3 has been purged of DHF. Preferably, the shutoff valve 137 is closed after the confirmation of the complete replacement of DHF with pure water on the basis of a measured DHF concentration measured by the concentration meter 53.

After the completion of rinsing the wafers W with pure water, the wafer carrying device 8 is raised from the inner tank 30 into the drying unit 6. Preferably, the supply of cold $N_2$ through the cold $N_2$ supply line 25 is stopped after the completion of the rinsing process for rinsing the wafers W, while the supply of hot $N_2$ through the hot $N_2$ supply line 24 is continued while the wafers W are being moved to keep warming the processing gas supply lines 21. In this state, hot $N_2$ may be supplied through the hot $N_2$ supply line 24 at a low flow rate, for example, on the order of 15 l/min and a preferable temperature of hot $N_2$ is, for example, on the order of 250° C.

Figure 11:
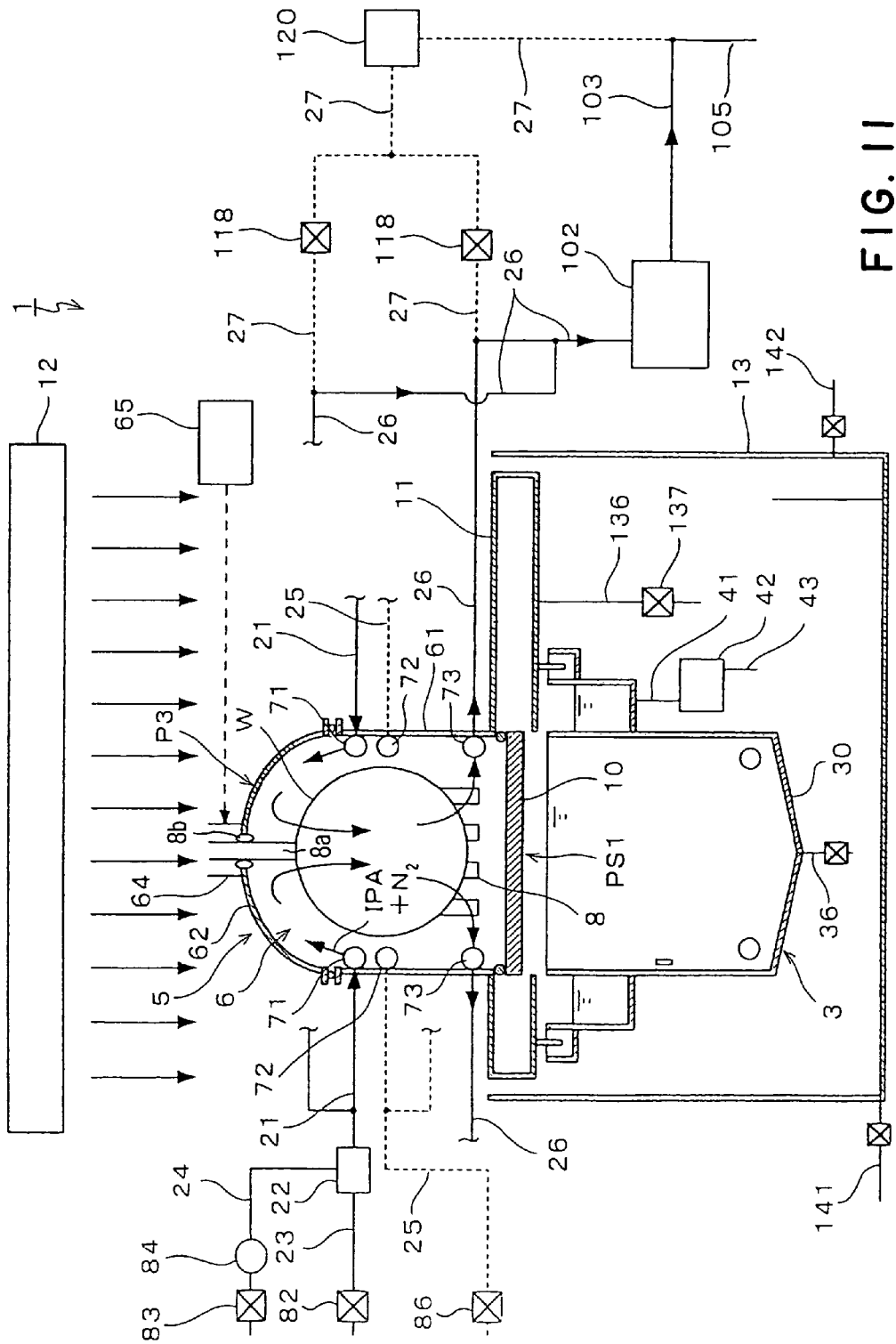
FIG. 11 is a diagrammatic view of the substrate processing system in a state during a drying process.

The drying unit 6 is sealed as shown in FIG. 11 after the wafers W has been moved into the drying unit 6 by moving the shutter 10 to the closing position PS1 and by sealing the gap between the lifting bar 8a and the top cover 62 by the air grip seal 8b. The top cover 62 is kept continuously at the closed position P3. Then, IPA vapor is generated by the IPA vapor generator 22 by supplying IPA through the IPA supply line 23 and supplying hot $N_2$ through the hot $N_2$ supply line 24 into the IPA vapor generator 22. The IPA vapor generated by the IPA vapor generator 22 is supplied through the processing gas supply lines 21 into the vessel 5. The IPA vapor is supplied through the processing gas spouting nozzles 71 into the drying unit 6. The IPA vapor spouted through the outlets the processing gas spouting nozzles 71 flows upward through a space on the right or the left side of the wafers W toward the inside surface of the top cover 62. Then, the IPA vapor flows into spaces between the wafers W and flows downward along the surfaces of the wafers W. The IPA vapor which has reached a lower part of the drying unit 6 flows through the inlet slits 92 into the discharge pipes 73 and is discharged outside through the first discharge line 26. The wafers W are dried by the IPA vapor supplied into the drying unit 6. A preferable flow rate of hot $N_2$ in the hot $N_2$ supply line 24 is, for example, on the order of 100 l/min. Preferably, the temperature of hot $N_2$ flowing through the hot $N_2$ supply line 24 is in the range of about 82° C. to about 110° C.

Figure 12:
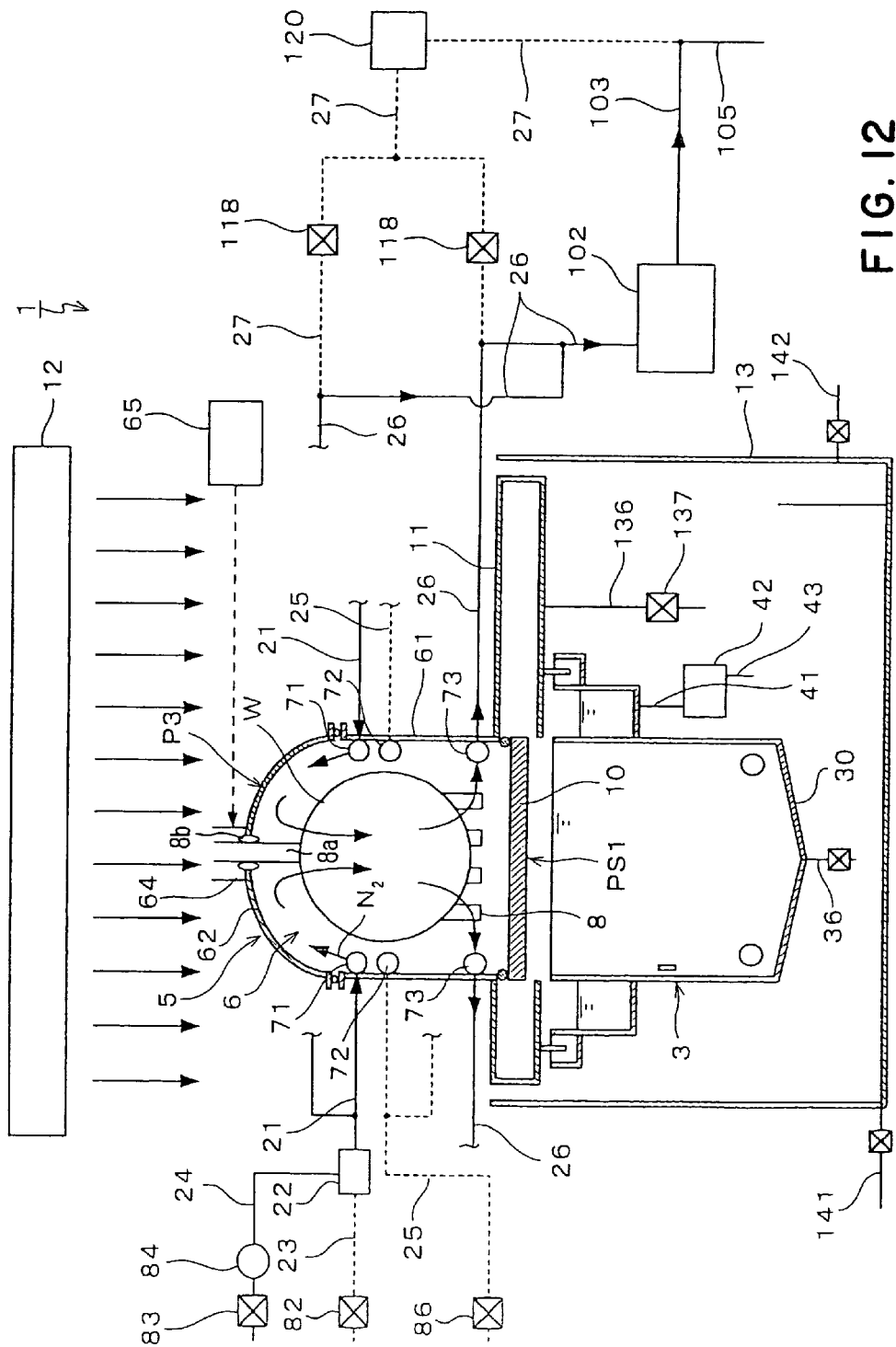
FIG. 12 is a diagrammatic view of the substrate processing system in a state during a purging operation for purging the drying unit.

The supply of IPA through the IPA supply line 23 is stopped to stop supplying IPA vapor through the processing gas supply lines 21, and then hot $N_2$ and cold $N_2$ are supplied respectively through the hot $N_2$ supply lines 24 and the cold $N_2$ supply lines 25 as shown in FIG. 12 after the completion of the drying process using IPA vapor for drying the wafers W to purge the drying unit 6 of the IPA vapor. Hot $N_2$ and cold $N_2$ are spouted into the drying unit 6 respectively through the processing gas spouting nozzles 71 and the cold $N_2$ spouting nozzles 72. The hot $N_2$ and the cold $N_2$ flow upward toward an upper part of the inside surface of the top cover 62, and then flow downward in the drying unit 6. An atmosphere in the drying unit 6 is forced to flow through the inlet slits 92 into the discharge pipes 73 and is discharged outside through the first discharge lines 26. Thus $N_2$ is supplied into the drying unit 6 to discharge the IPA vapor remaining inside the drying unit 6 through the first discharge lines 26, so that the atmosphere in the drying unit is replaced with $N_2$. A preferable flow rate of the hot $N_2$ in the hot $N_2$ supply line 24 is, for example, on the order of 100 l/min and a preferable flow rate of the cold $N_2$ in the cold $N_2$ supply line 25 is, for example, on the order of 200 l/min.

After the drying unit 6 has been purged by using $N_2$, the air grip seal 8b is disengaged, the top cover 62 is shifted to the open position P1, and the wafers W are carried outside the vessel body 61 after the wafer carrying device 8 is raised above the open upper end 61a of the vessel body 61. Thus the operation of the substrate processing system 1 for cleaning the wafers W is completed.

The atmosphere in the drying unit 6 of the substrate processing system 1 can be discharged through the second discharge line 27. Therefore, the atmosphere in the drying unit 6 can be discharged at an increased discharge rate. The open upper end 61a is kept open to open the drying unit 6 into the atmosphere while DHF is contained in the processing tank 3. Therefore, clean air supplied by the FFU 12 is able to flow into the drying unit 6 and currents of clean air can be produced in the drying unit 6. Therefore, the upward flow of the atmosphere of DHF from the processing tank 3 into the drying unit 6 can be prevented. Consequently, the adhesion of the atmosphere of DHF to the wafers W held in the drying unit 6 and the resulting formation of water marks on the wafers W can be prevented. Films can be satisfactorily formed on the wafers W thus cleaned by the cleaning process and causation of problems in the electrical characteristic of semiconductor devices formed by processing the wafers can be prevented.

Nitrogen gas can be supplied at a high supply rate by simultaneously supplying hot $N_2$ and cold $N_2$ respectively through the hot $N_2$ supply line 24 and the cold $N_2$ supply line 25 to prevent the IPA vapor from remaining on the inside surface of the vessel 5 and the surfaces of the wafers W.

Although the invention has been described in its preferred embodiment, the present invention is not limited in its practical application to the preferred embodiment specifically described herein. For example, processing liquids and processing gases that can be used by the substrate processing system 1 are not limited to DHF as a chemical, pure water as a rinsing liquid and IPA vapor as a drying gas mentioned in the foregoing description. The substrate processing system 1 may be capable of processing wafers by processes other than the cleaning process. The substrates are not limited to semiconductor wafers and may be glass substrates for LCD panels, substrates for forming CDs, printed wiring boards, ceramic substrates or such.

The vessel 5 may be provided with a heater for raising the temperature of the inside surface of the vessel 5. The adhesion of the IPA vapor to the inside surface of the vessel 5 can be effectively prevented by raising the temperature of the inside surface of the vessel 5 by the heater during the drying process using the IPA vapor for drying the wafers W. Consequently, the IPA vapor is applied efficiently to the wafers W and the consumption of the IPA vapor can be reduced. The IPA vapor can be prevented from remaining on the inside surface of the vessel 5. For example, the inside surfaces of the top cover 62 and the vessel body 61 may be heated by rubber heaters attached to the outside surfaces of the top cover 62 and the vessel body 61. Preferably, the temperature of the inside surface of the top cover 62 is lower than that of the wafers W. Preferably, the temperature of the inside surface of the vessel 5 heated by the heater is, for example, on the order of 85° C.

Although in this embodiment, the complete replacement of DHF contained in the processing tank 3 with pure water is confirmed on the basis of a value measured by the concentration meter 53 place in the processing tank 3, the complete replacement of DHF contained in the processing tank 3 with pure water can be confirmed on the basis of a resistivity measured by a resistivity meter place in the processing tank 3.

Although in this embodiment the atmosphere in the drying unit 6 is discharged through the first discharge lines 26 when the drying unit 6 is purged of the atmosphere by using $N_2$ after completing the drying process using the IPA vapor for drying the wafers W, the pressure in the drying unit 6 may be reduced by forcibly discharging the atmosphere in the drying unit 6 through the second discharge line 27. Reduction of the pressure in the drying unit 6 promotes the volatilization of the IPA vapor remaining in the drying unit 6 and, consequently, the IPA vapor can be prevented from remaining on the inside surface of the vessel 5 and the surfaces of the wafers W.

In this embodiment, the atmosphere in the drying unit 6 is discharged forcibly through the second discharge line 27 during the chemical process, and then the atmosphere in the drying unit 6 is discharged at a discharge rate lower than that at which the atmosphere in the drying unit 6 is discharged during the chemical process through the first discharge lines 26. However, the forced discharge may be omitted or the second discharge line 27 may be omitted if the pressure in the first discharge lines 26 can be sufficiently reduced relative to the pressure in the drying unit 6 and the atmosphere in the drying unit 6 can be discharged only through the first discharge lines 26 at a discharge rate sufficient to make clean air flow into the drying unit 6 and to produce currents of the clean air in the drying unit 6.

In this embodiment, hot $N_2$ is supplied through the hot $N_2$ supply line 24 before the wafers W is carried into the substrate processing system 1 and supplying hot $N_2$ is kept until the start of supplying the IPA vapor after the completion of the rinsing process using pure water to heat the processing gas supply lines 21 by the hot $N_2$. Supply of the hot $N_2$ through the hot $N_2$ supply line 24 may be stopped during the chemical treatment of the wafers W by the chemical process.

In this embodiment, hot $N_2$ and cold $N_2$ are supplied respectively through the hot $N_2$ supply line 24 and the cold $N_2$ supply line 25 and the atmosphere in the drying unit 6 is discharged to replace the atmosphere in the drying unit 6 with an atmosphere of $N_2$. The cold $N_2$ supply line 25 may be omitted and only hog $N_2$ may be supplied through the hot $N_2$ supply line 24 into the drying unit 6.

In this embodiment, the drying unit 6 is sealed after moving the wafers W into the drying unit 6, and then the IPA vapor is supplied into the drying unit 6 for the drying process. The IPA vapor may be supplied through the processing gas supply lines 21 into the drying unit 6 while the wafers W are being moved from the processing tank 3 into the drying unit 6.

In this embodiment, the top cover 62 is held at the half-open position P2 to open the drying unit 6 into the atmosphere and the top cover 62 is held at the closed position P3 to isolate the interior of the drying unit 6 from the atmosphere. The drying unit 6 may be opened into the atmosphere and sealed by any suitable means other than that mentioned above. For example, the substrate processing system may include a top cover 62 provided with an opening (vent) 150, a lid 151 for covering the opening 150, and a lid lifting mechanism 152 for vertically moving the lid 151 as shown in FIG. 13. The substrate processing system may include a control unit 153 for controlling the operation of the lid lifting mechanism 152. The opening 150 is opened by lifting up the lid 151 by the lid lifting mechanism 152 to open the drying unit 6 into the atmosphere. The opening 150 is closed by lowering the lid 151 by the lid lifting mechanism 152 so as to cover the opening 150 to isolate the interior of the drying unit 6 from the atmosphere. When the wafers W are loaded into the substrate processing system 1, the atmosphere in the drying unit 6 is discharged forcibly through the discharge pipes 73. Since the open upper end 61a is opened to open the drying unit 6 into the atmosphere, clean air supplied by the FFU 12 and flowing down flows through the open upper end 61a into the drying unit 6 and currents of the clean air flowing from the open upper end 61a toward the discharge pipes 73 are produced. The top cover 62 closes the open upper end 61a of the vessel body 61 after the wafers W have been carried into the vessel body 61. Subsequently, the control unit 153 controls the lid lifting mechanism 152 to open the opening 150 by lifting up the lid 151. The opening 150 is kept open and the atmosphere in the drying unit 6 is discharged forcibly through the discharge pipes 73 during the chemical process and the processing liquid changing process for replacing the DHF contained in the processing tank 3 with pure water. Consequently, clean air supplied by the FFU 12 flows through the opening 150 into the drying unit 6 and the clean air flows in currents from the opening 150 toward the discharge pipes 73. The opening 150 is closed after the DHF contained in the inner tank 30 has been replaced with pure water. Thus the upward flow of an atmosphere of DHF from the processing tank 3 into the drying unit 6 can be prevented by producing the air currents in the drying unit 6 while the DHF is remaining in the processing tank 3.

Figure 14:
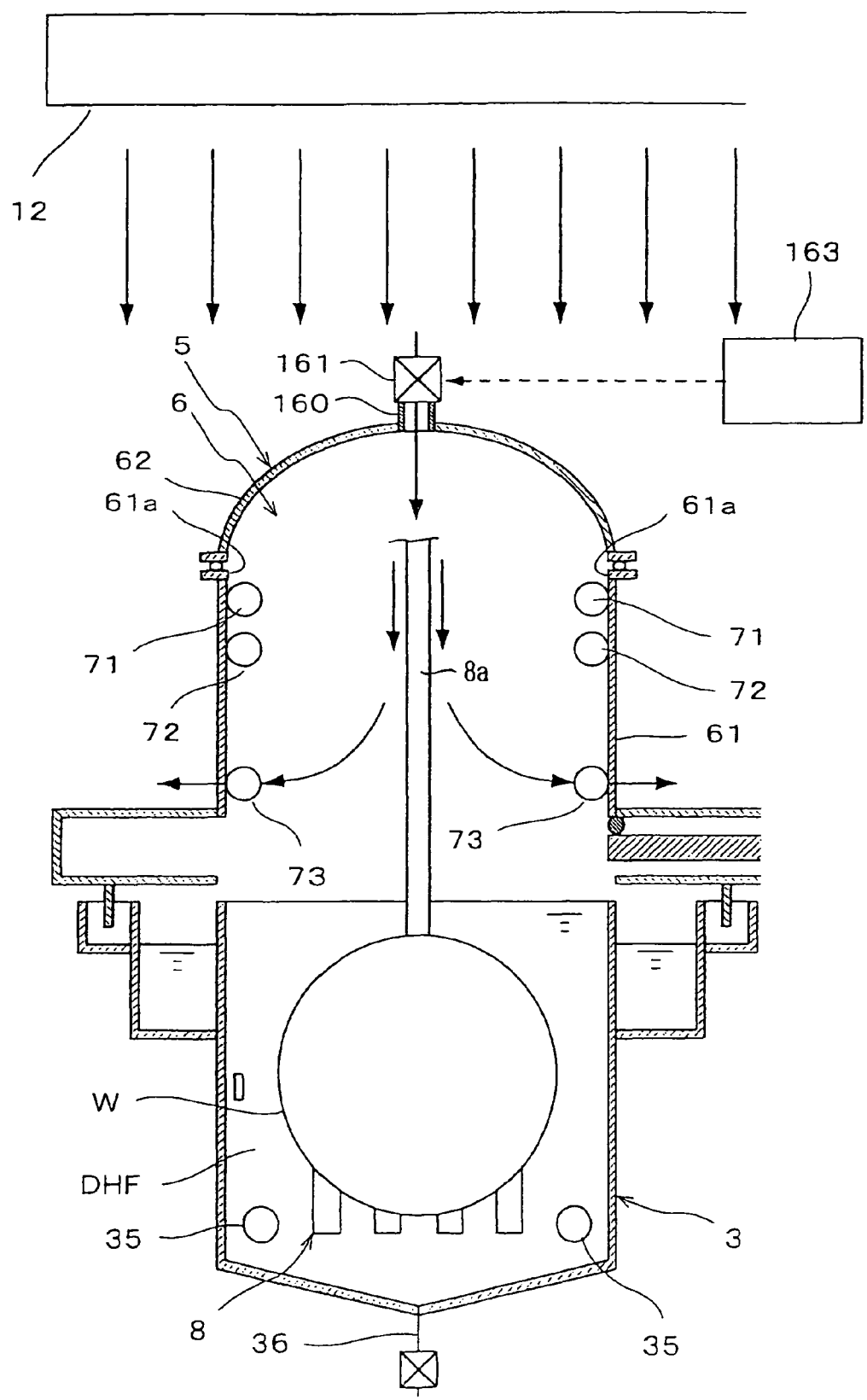
FIG. 14 is a schematic sectional view of a substrate processing system including a top cover provided with a pipe and a shutoff valve in a state during a chemical processing process.

The substrate processing system 1 may include a pipe 160 connected to the top cover 62 and a shutoff valve 161 placed in the pipe 160 as shown in FIG. 14. Referring to FIG. 14, the pipe 160 has an open lower end coinciding with the inside surface of an upper part of the top cover 62. The substrate processing system 1 may include a control unit 163 for controlling the shutoff valve 161. The shutoff valve 161 is opened to make the interior of the drying unit 6 communicate with the atmosphere by means of the pipe 160. The shutoff valve 161 is closed to isolate the interior of the drying unit 6 from the atmosphere. The atmosphere in the drying unit 6 is discharged forcibly through the discharge pipes 73 when the wafers W are carried into the substrate processing system 1. Consequently, the down flow of clean air supplied by the FFU 12 flows through the open upper end 61a into the drying unit 6 and currents of the clean air flowing from the open upper end 61a toward the discharge pipes 73 are produced. The open upper end 61a of the vessel body 61 is covered with the top cover 62 after the wafers W have been carried into the vessel body 61, and then the control unit 163 opens the shutoff valve 161. The shutoff valve 161 is kept open and the atmosphere in the drying unit 6 is discharged forcibly through the discharge pipes 73 during the chemical process and the processing liquid changing process for replacing the DHF contained in the processing tank 3 with pure water. Consequently, clean air supplied by the FFU 12 flows through the pipe 160 into the drying unit 6 and the clean air flows in currents from the pipe 160 toward the discharge pipes 73. The shutoff valve 161 is closed after the DHF contained in the inner tank 30 has been replaced with pure water. Thus the upward flow of an atmosphere of DHF from the processing tank 3 into the drying unit 6 can be prevented by producing the air currents in the drying unit 6 while the DHF is remaining in the processing tank 3.

The invention claimed is:

1. A substrate processing system comprising:
a processing tank for processing substrates with a processing liquid;
a drying unit including openings connected to the outside atmosphere, disposed above the processing tank;
a carrying mechanism for carrying the substrates between the processing tank and the drying unit;
a processing gas supply line for supplying a processing gas into the drying unit;
inert gas supply lines for supplying an inert gas into the drying unit;
a first discharge line for discharging an atmosphere purged from the drying unit; and
a second discharge line for forcibly exhausting the drying unit,
wherein the drying unit is constructed such that the drying unit can be set in an open state in which the drying unit opens into the outside atmosphere by opening the openings and in a closed state in which the interior of the drying unit is isolated from the outside atmosphere by closing the openings, and
a controller sets the drying unit selectively in either of the open state in which the drying unit opens into the outside atmosphere and the closed state in which the interior of the drying unit is isolated from the outside atmosphere, and
wherein in the open state of the drying unit, currents of clean air are formed in the drying unit from the openings connected to the outside atmosphere to the first and second discharge lines by operating the first and second discharge lines.

2. The substrate processing system according to claim 1, wherein a first inert gas supply line for carrying a heated inert gas is connected to the processing gas supply line, and the inert gas supply line serves as a second inert gas supply line for carrying an inert gas of an ordinary temperature.

3. The substrate processing system according to claim 1, wherein the drying unit is provided with discharge pipes each having a base part connected to the first discharge line and a free end part inserted in the drying unit, each of the discharge pipes is provided with a plurality of inlet holes arranged in a line, areas of the inlet holes of each discharge pipe nearer to the base part are smaller and those of the inlet holes of the discharge nozzle nearer to the free end part are greater.

4. The substrate processing system according to claim 1, wherein the processing tank processes the substrates with a chemical and a rising liquid, and the controller opens the drying unit into the outside atmosphere when the chemical is contained in the processing tank, isolates the interior of the drying unit from the outside atmosphere upon the completion of replacing the chemical contained in the processing tank with the rinsing liquid and isolates the interior of the drying unit from the outside atmosphere while the drying unit is operating for a drying process.

5. The substrate processing system according to claim 1, wherein the drying unit includes a vessel body having an open end, a top cover for covering the open end of the vessel body, and a top cover lifting mechanism combined with the top cover and capable of placing the top cover at an open position for carrying the substrates into and out of the vessel, a half-open position for forming a gap between the open end of the vessel and the top cover or a closing position for closing the open end of the vessel body, the top cover lifting mechanism is controlled by the controller, and the controller controls the top cover lifting mechanism to place the top cover at the open position or the half-open position to open the drying unit into the outside atmosphere and to place the top cover at the closing positing to isolate the interior of the drying unit from the outside atmosphere.

6. The substrate processing system according to claim 1, wherein the drying unit includes a vessel body defining a chamber and having an open end, a top cover for covering the open end of the vessel body, the top cover is provided with a vent, a vent closing member closes the vent, and the controller controls the vent closing member.

* * * * *